United States Patent
Kasahara

(10) Patent No.: US 11,923,282 B2
(45) Date of Patent: Mar. 5, 2024

(54) WIRING SUBSTRATE

(71) Applicant: SHINKO ELECTRIC INDUSTRIES CO., LTD., Nagano (JP)

(72) Inventor: Tetsuichiro Kasahara, Nagano (JP)

(73) Assignee: SHINKO ELECTRIC INDUSTRIES CO., LTD., Nagano-Ken (JP)

( * ) Notice: Subject to any disclaimer, the term of this patent is extended or adjusted under 35 U.S.C. 154(b) by 630 days.

(21) Appl. No.: 17/162,628

(22) Filed: Jan. 29, 2021

(65) Prior Publication Data

US 2021/0151371 A1 May 20, 2021

Related U.S. Application Data

(62) Division of application No. 15/964,594, filed on Apr. 27, 2018, now abandoned.

(30) Foreign Application Priority Data

May 12, 2017 (JP) .................. 2017-095240

(51) Int. Cl.
*H01L 21/00* (2006.01)
*H01L 21/48* (2006.01)
*H01L 23/498* (2006.01)

(52) U.S. Cl.
CPC ...... *H01L 23/49822* (2013.01); *H01L 21/486* (2013.01); *H01L 23/49827* (2013.01);
(Continued)

(58) Field of Classification Search
CPC ............. H01L 23/49822; H01L 21/486; H01L 23/49827; H01L 23/49838; H01L 21/4857; H01L 2224/48091
See application file for complete search history.

(56) References Cited

U.S. PATENT DOCUMENTS 6,828,510 B1 12/2004 Asai et al.
8,188,380 B2 5/2012 Kawai et al.
(Continued)

FOREIGN PATENT DOCUMENTS

JP H11-298143 A 10/1999
JP 2002-141629 A 5/2002
(Continued)

OTHER PUBLICATIONS

Japanese Office Action for Application No. 2017-095240 dated Dec. 1, 2020.
(Continued)

*Primary Examiner* — Richard A Booth
(74) *Attorney, Agent, or Firm* — TAROLLI, SUNDHEIM, COVELL & TUMMINO L.L.P.

(57) ABSTRACT

A wiring substrate includes an insulation layer, a first wiring layer, and a second wiring layer. The first wiring layer is embedded in the insulation layer with an upper surface of the first wiring layer exposed from the insulation layer. The second wiring layer includes a terminal portion located at a lower position than a lower surface of the insulation layer and an embedded portion embedded in the insulation layer. The wiring substrate further includes a connection via connecting the first wiring layer and the embedded portion. The insulation layer includes an extension between the embedded portion and a lower surface of the first wiring layer. The extension includes a through hole. The connection via is located in the through hole of the extension.

4 Claims, 25 Drawing Sheets

(52) U.S. Cl.
CPC .... *H01L 23/49838* (2013.01); *H01L 21/4857* (2013.01); *H01L 2224/48091* (2013.01)

(56) References Cited

U.S. PATENT DOCUMENTS

| | | |
|---|---|---|
| 11,802,740 B2 * | 10/2023 | Machida ............... F28D 15/043 |
| 2004/0140568 A1 | 7/2004 | Fukazawa |
| 2008/0012140 A1 | 1/2008 | Tsukano et al. |
| 2008/0264684 A1 | 10/2008 | Kang et al. |
| 2009/0137085 A1 | 5/2009 | Tsukano et al. |
| 2009/0309231 A1 * | 12/2009 | Machida ............. H01L 23/3128 257/773 |
| 2010/0163293 A1 | 7/2010 | Kawai et al. |
| 2012/0061347 A1 | 3/2012 | Kawai et al. |
| 2012/0073865 A1 | 3/2012 | Kang et al. |

FOREIGN PATENT DOCUMENTS

| | | |
|---|---|---|
| JP | 2008021921 A | 1/2008 |
| JP | 2009-194312 A | 8/2009 |
| JP | 2009302476 A | 12/2009 |
| JP | 2010056576 A | 3/2010 |
| JP | 2010157718 A | 7/2010 |
| JP | 2013062546 A | 4/2013 |

OTHER PUBLICATIONS

Japanese Office Action for Application No. 2017-095240 dated Aug. 25, 2020.
First Office Action issued in connection with corresponding Chinese Application No. 201810380988.7 dated Jan. 30, 2023.

\* cited by examiner

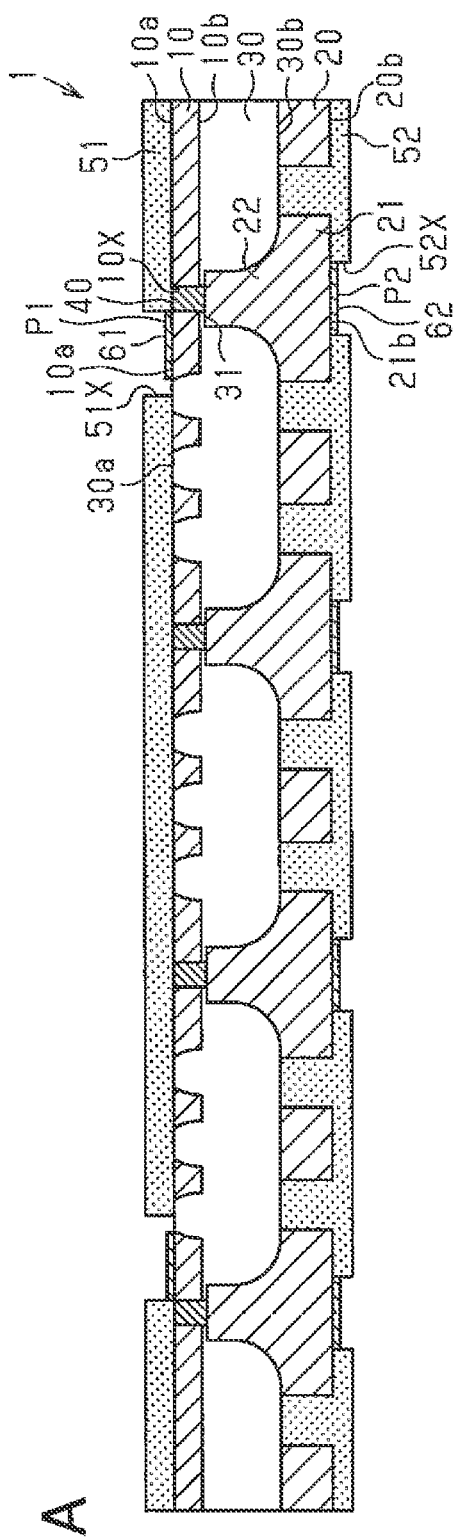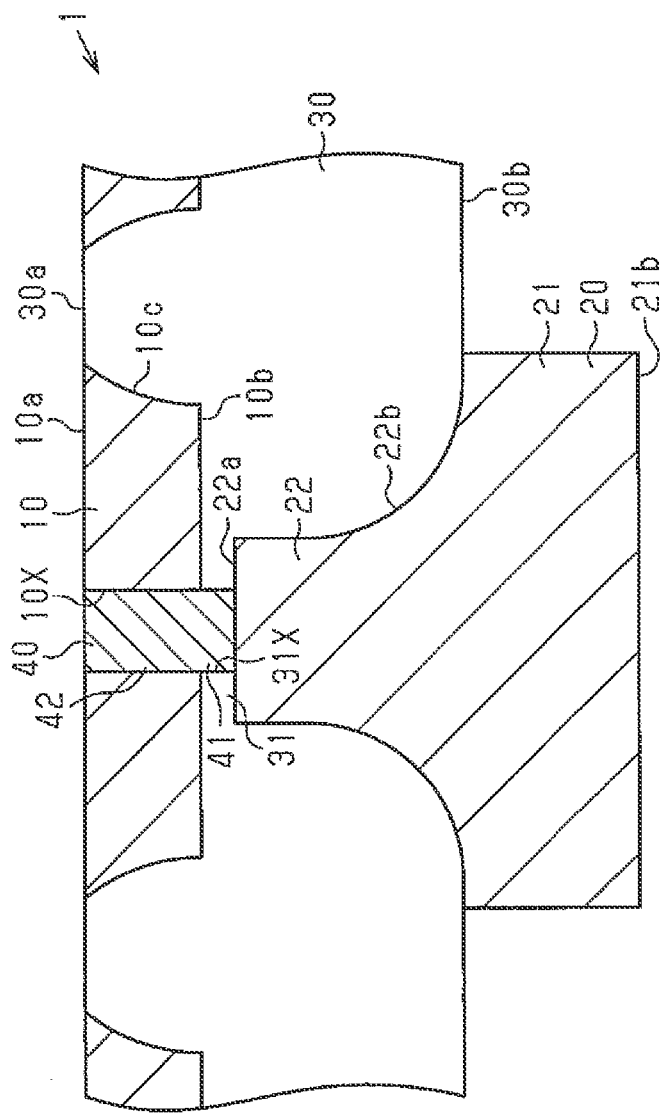

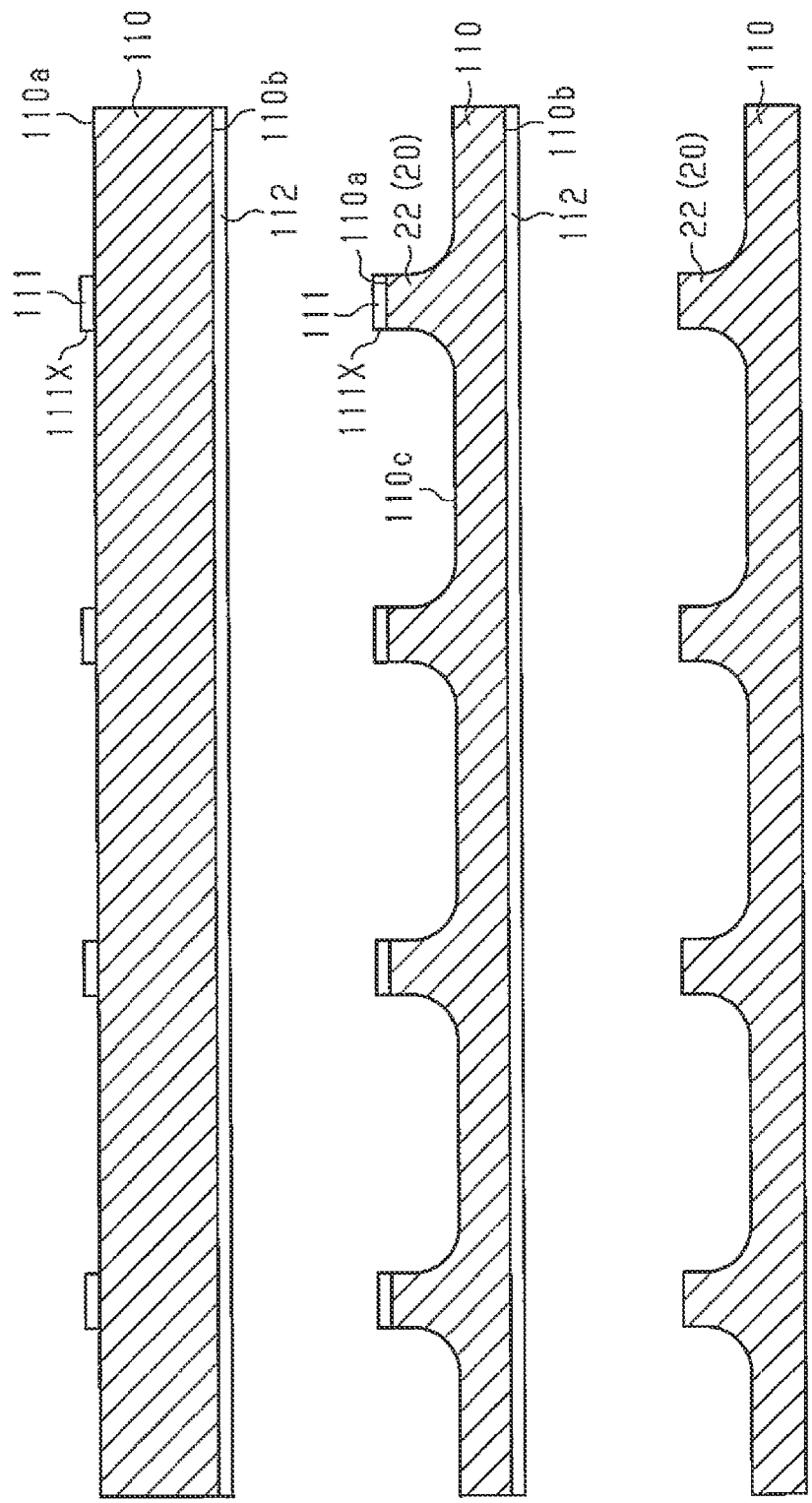

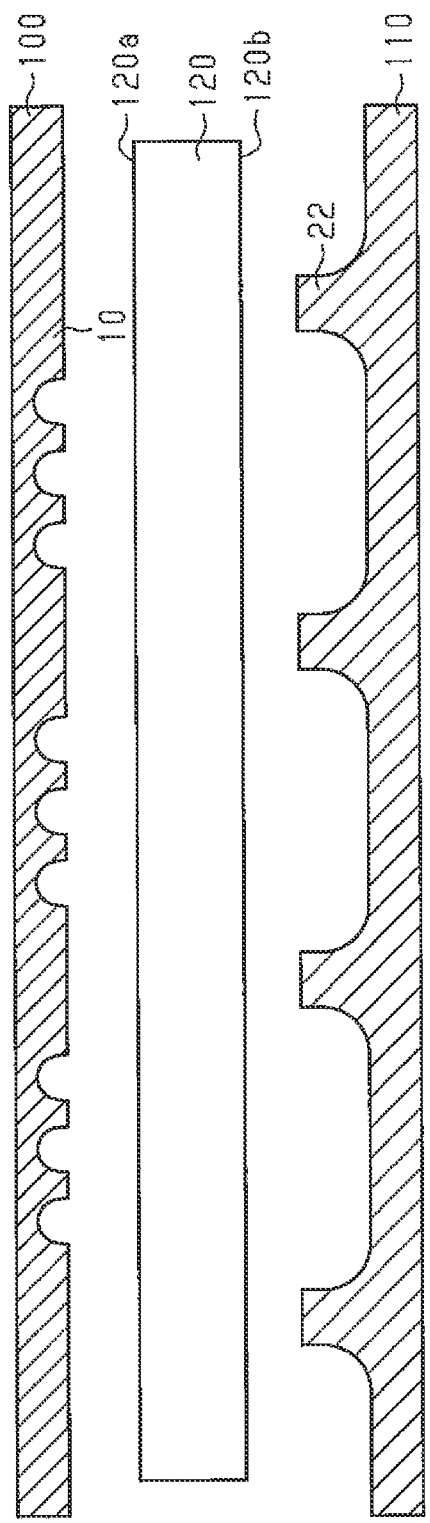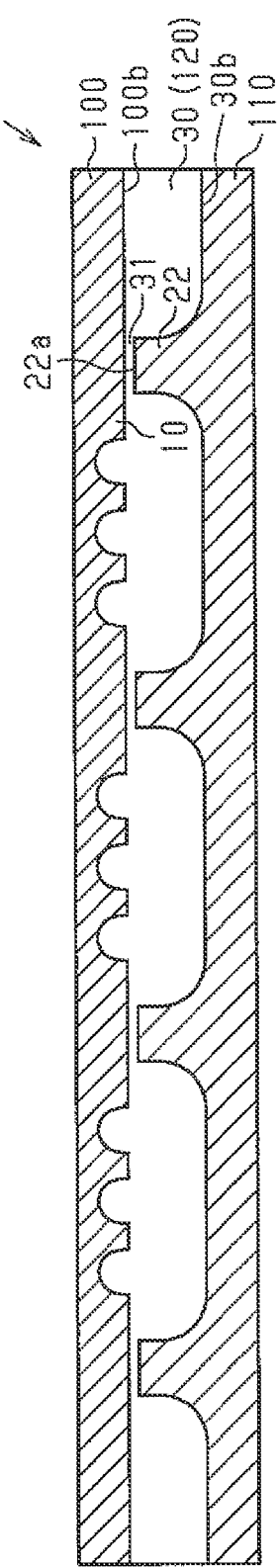

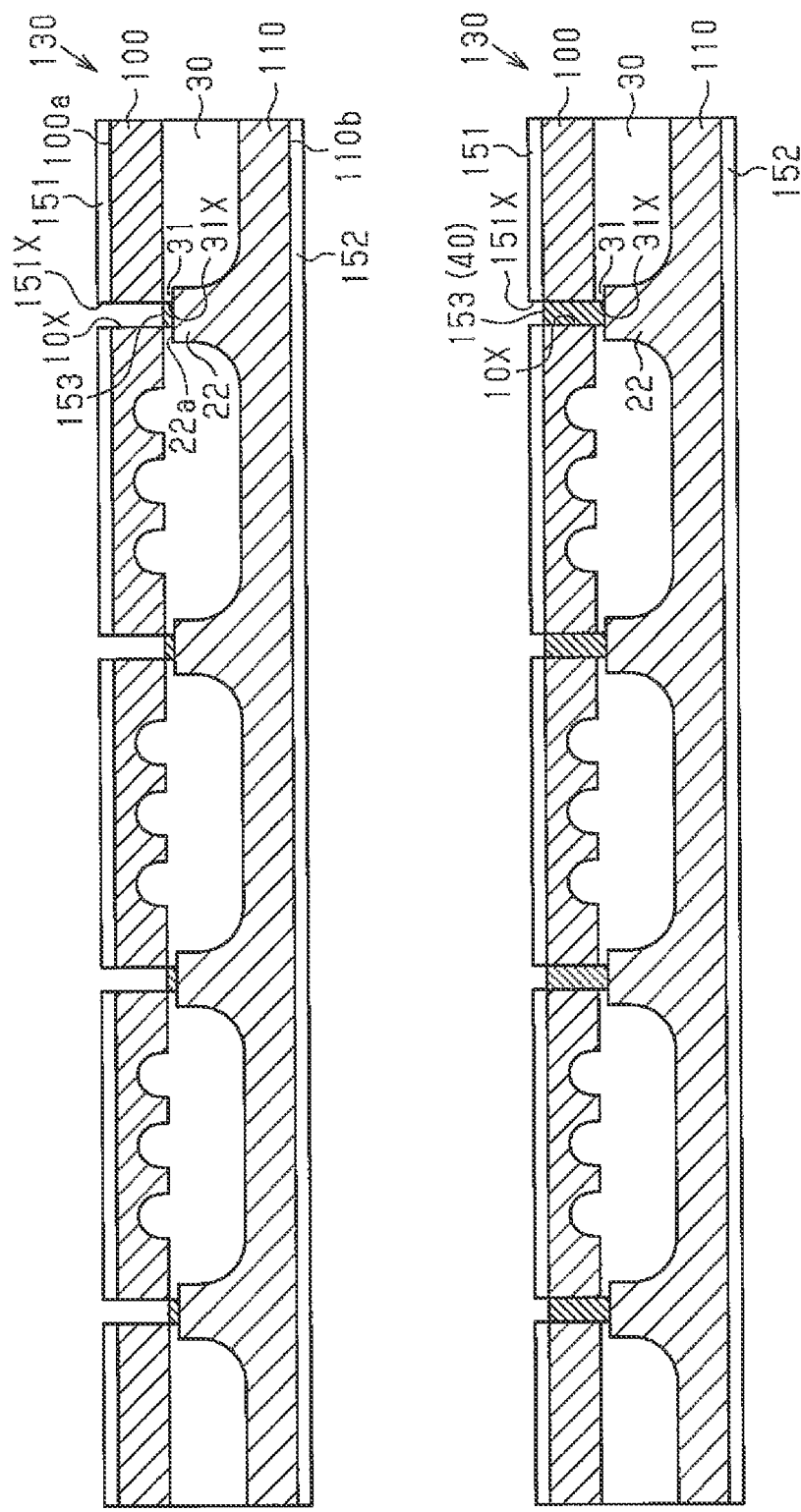

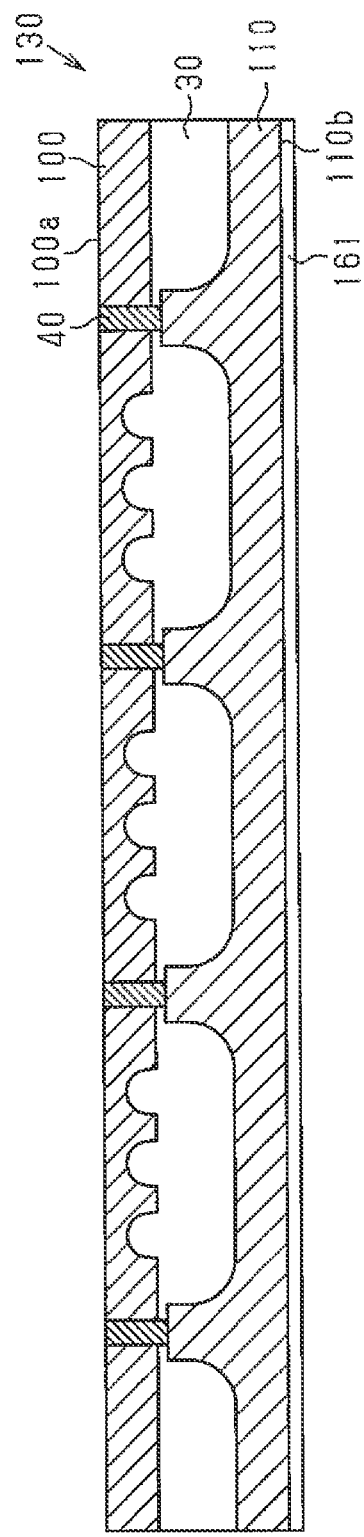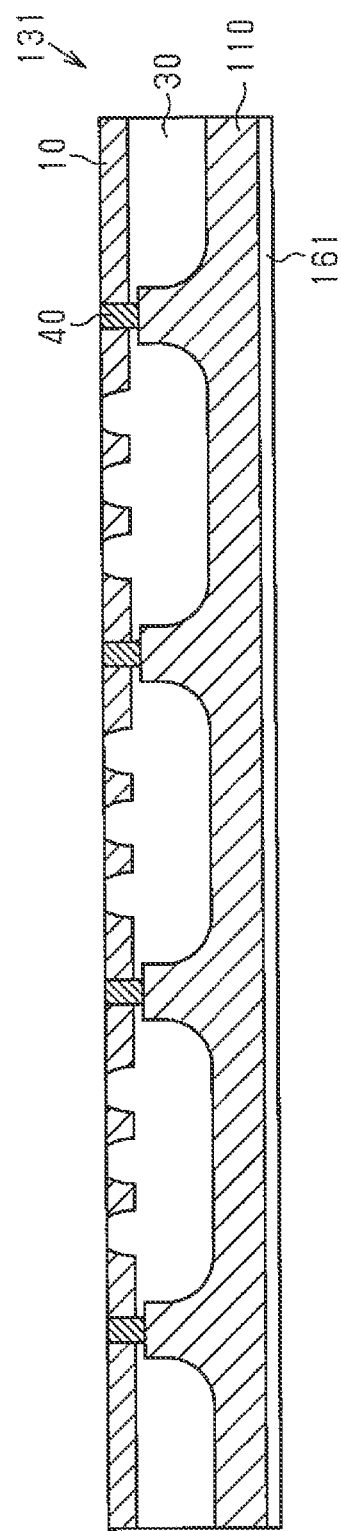

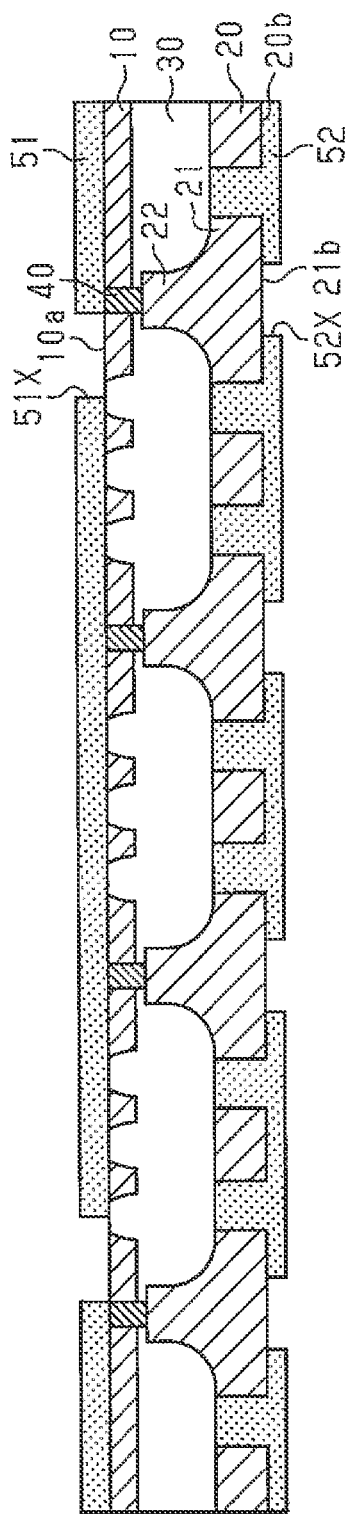
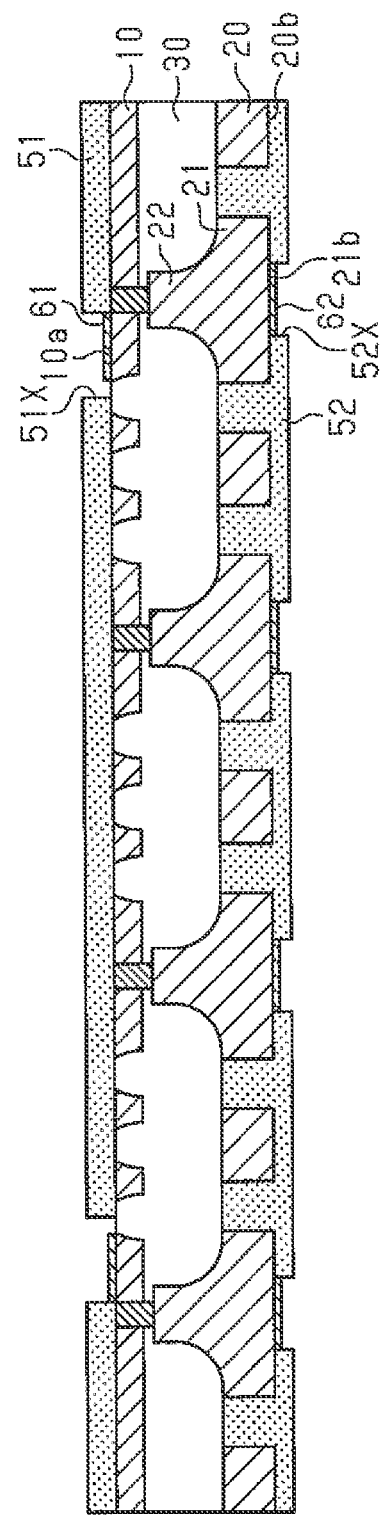
Fig.10A
Fig.10B

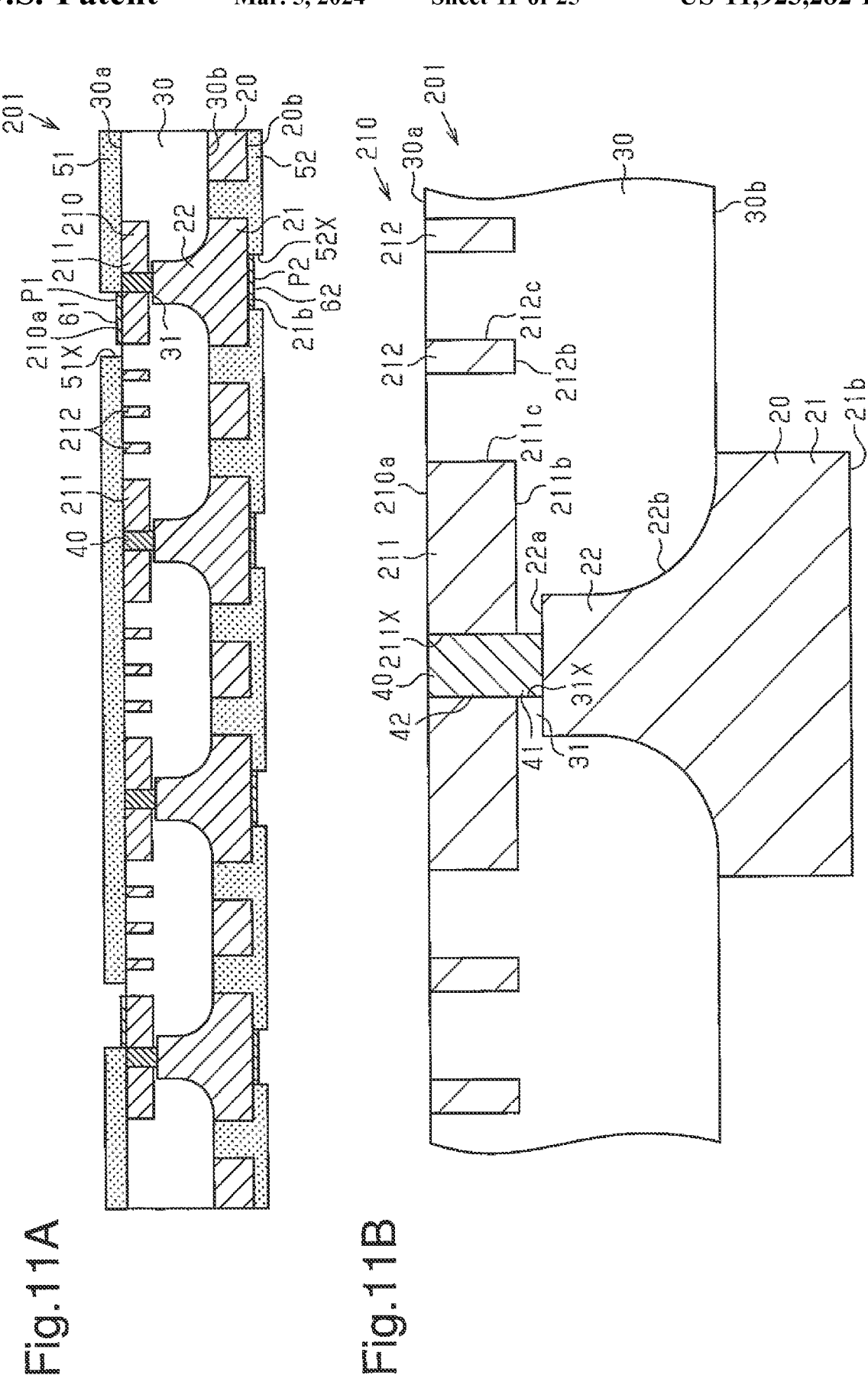

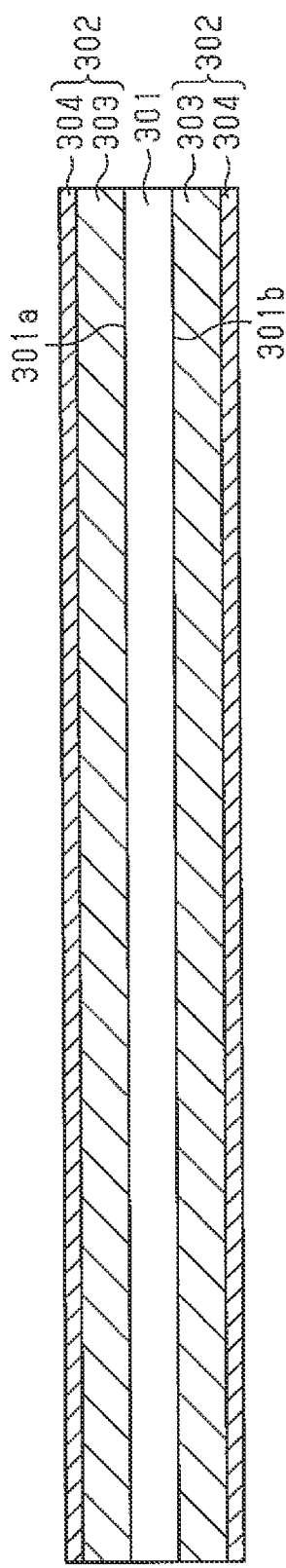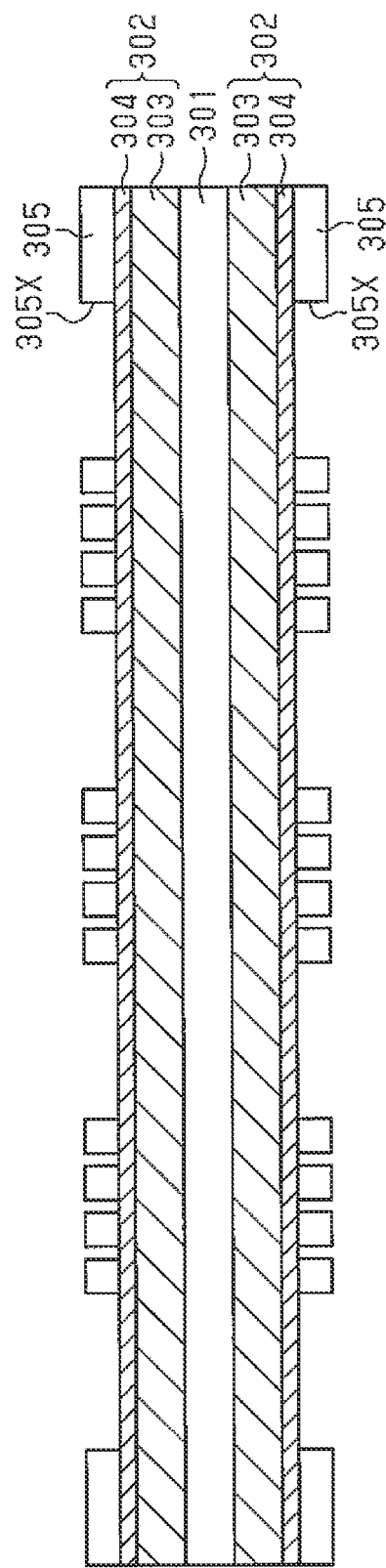

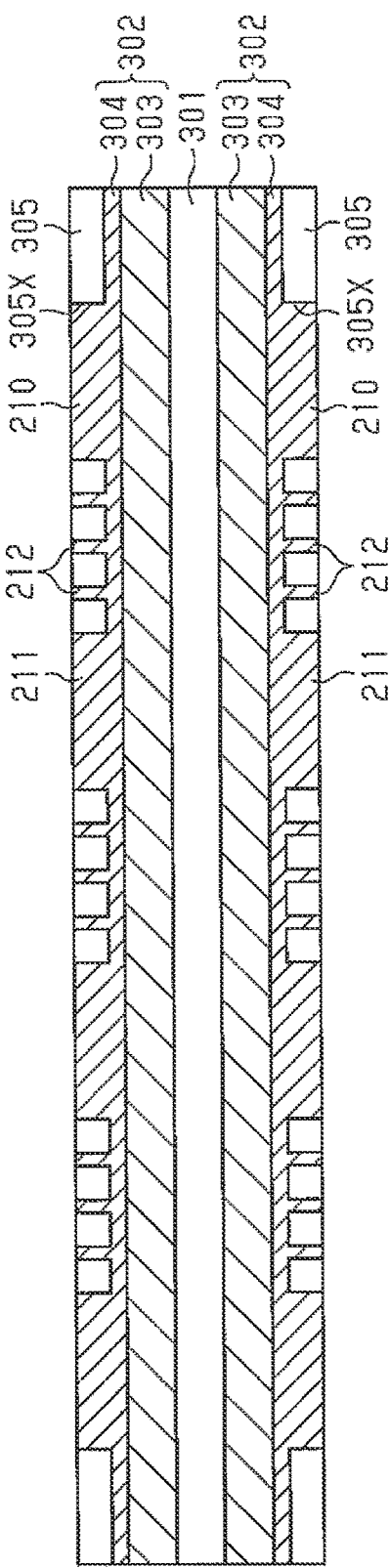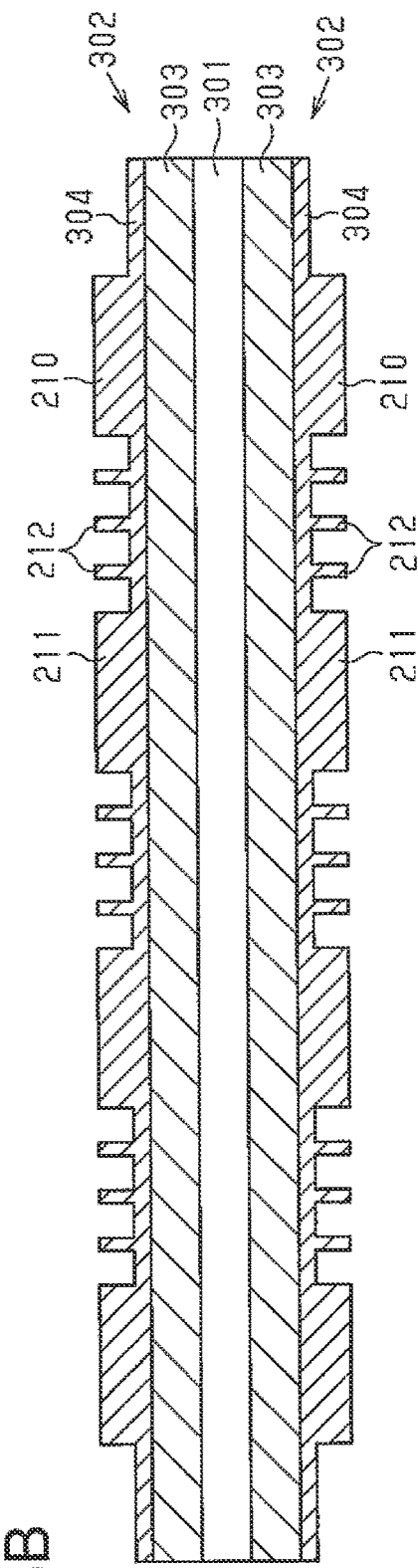

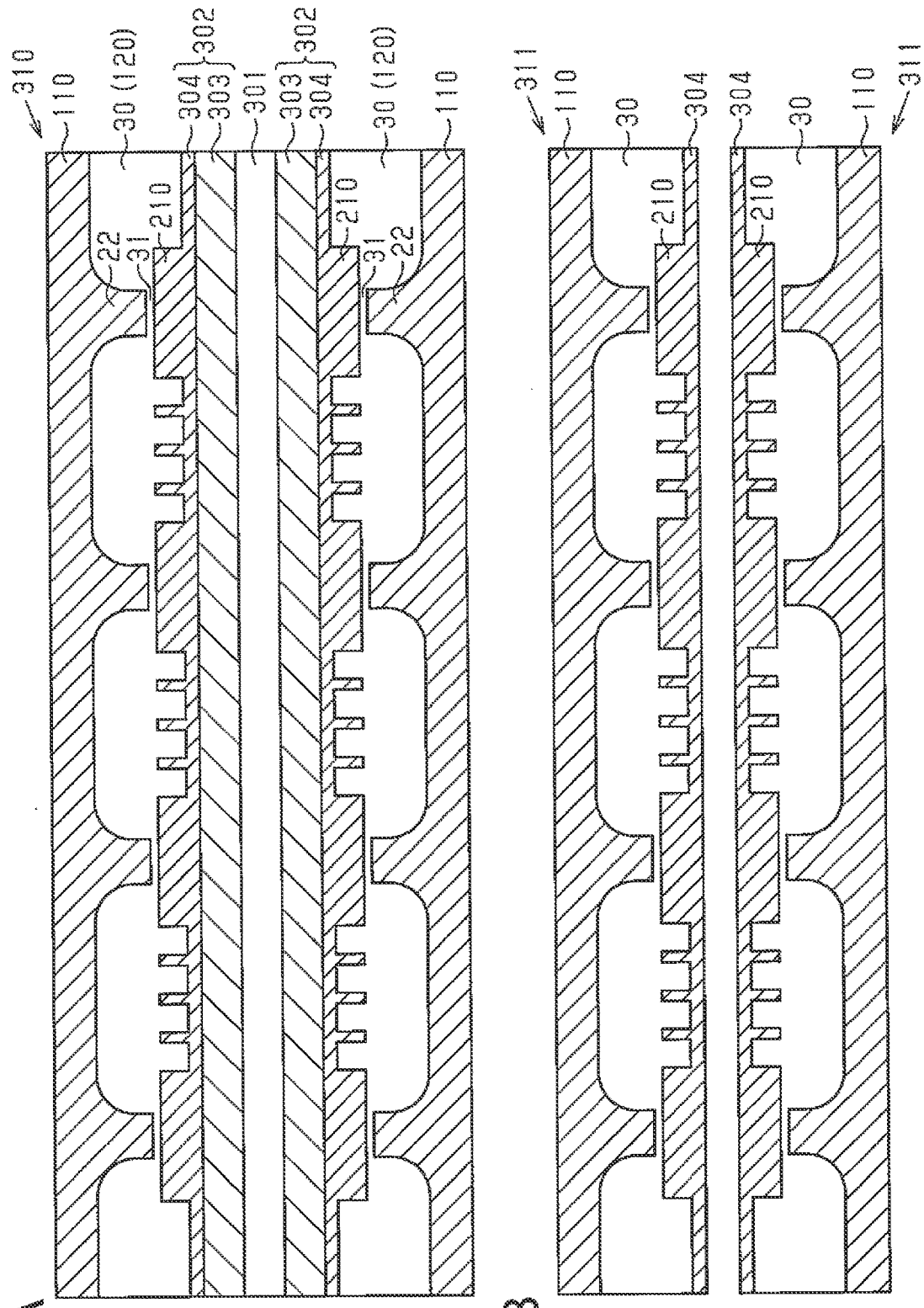

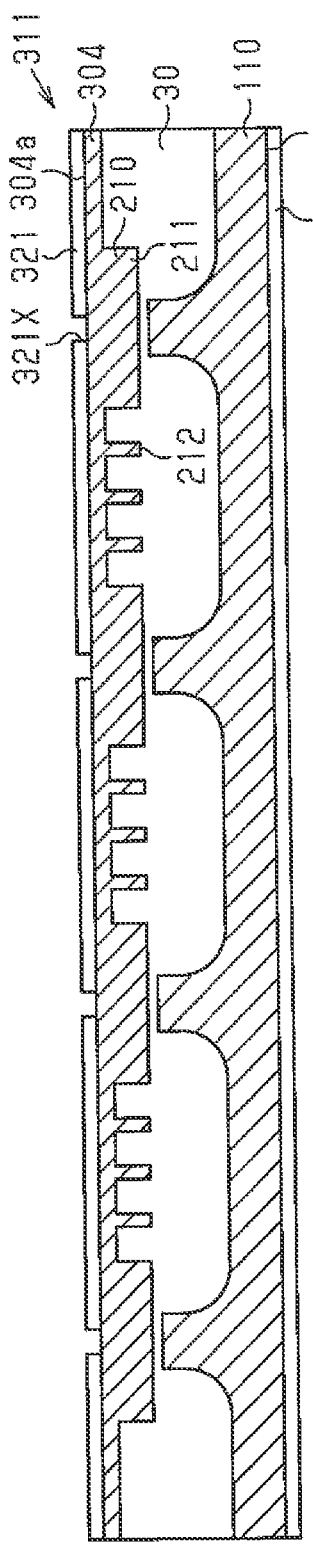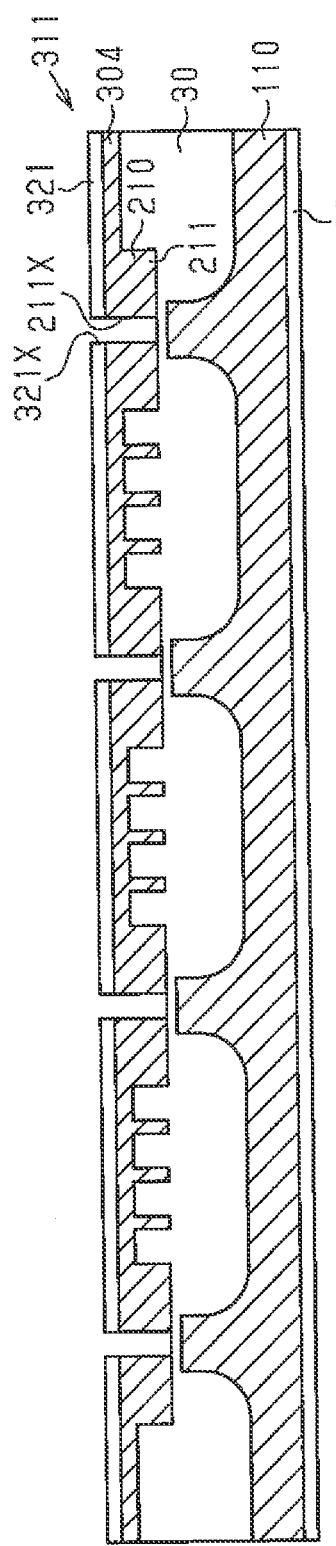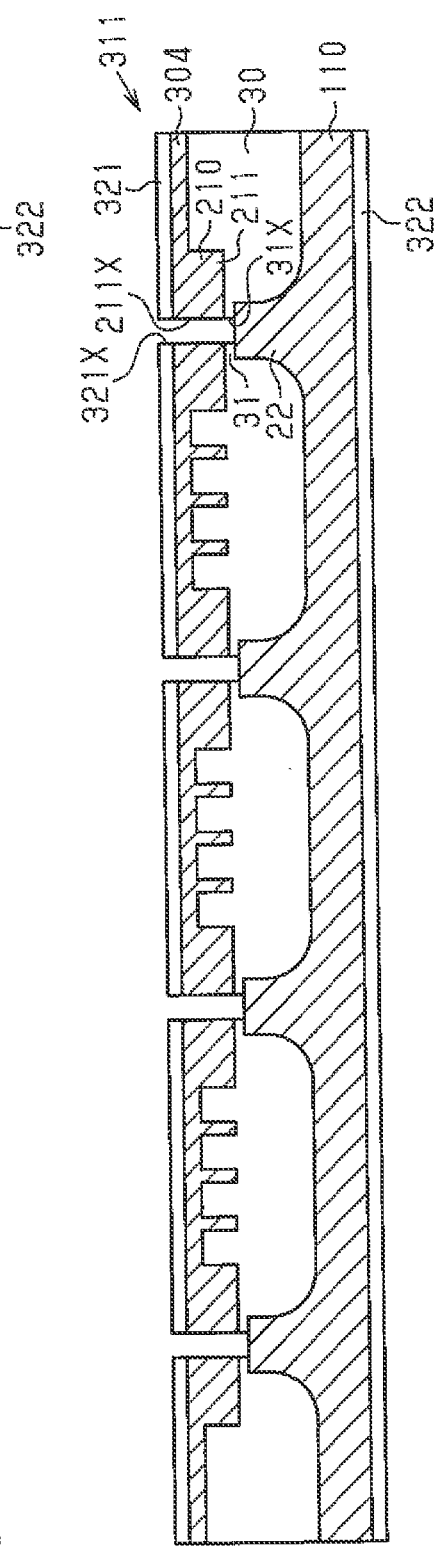

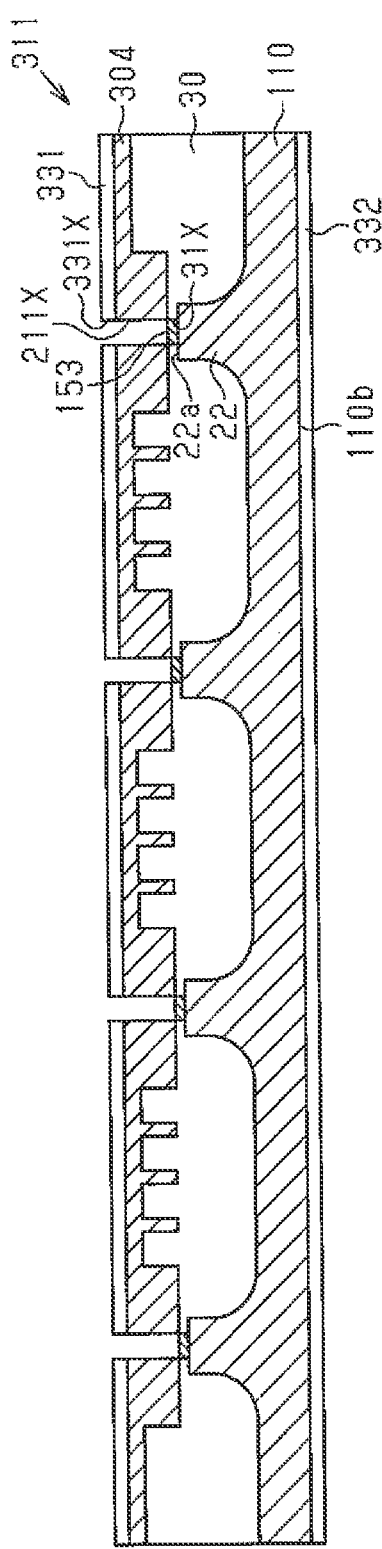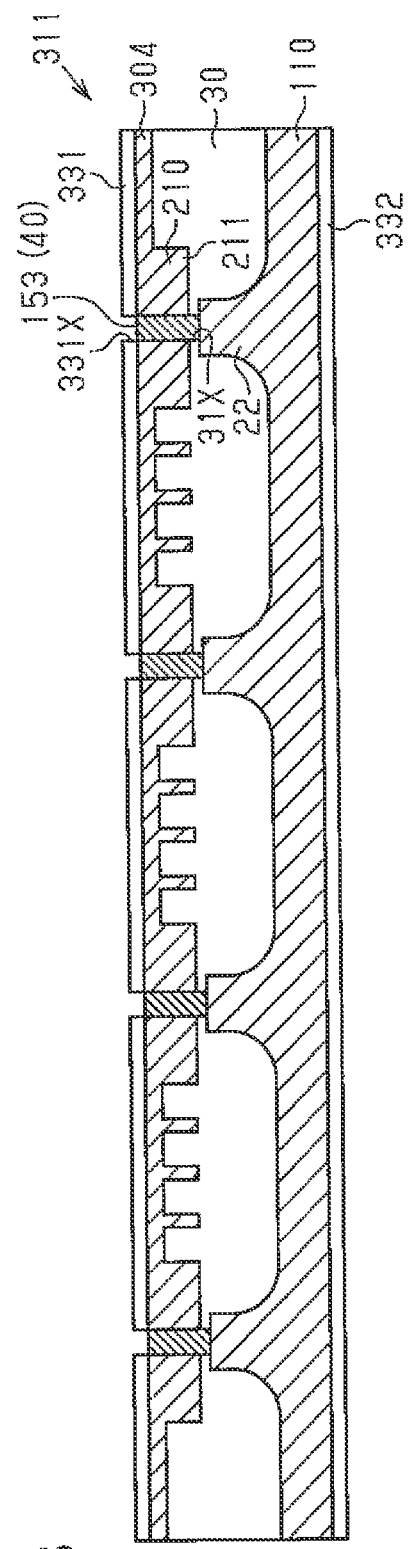

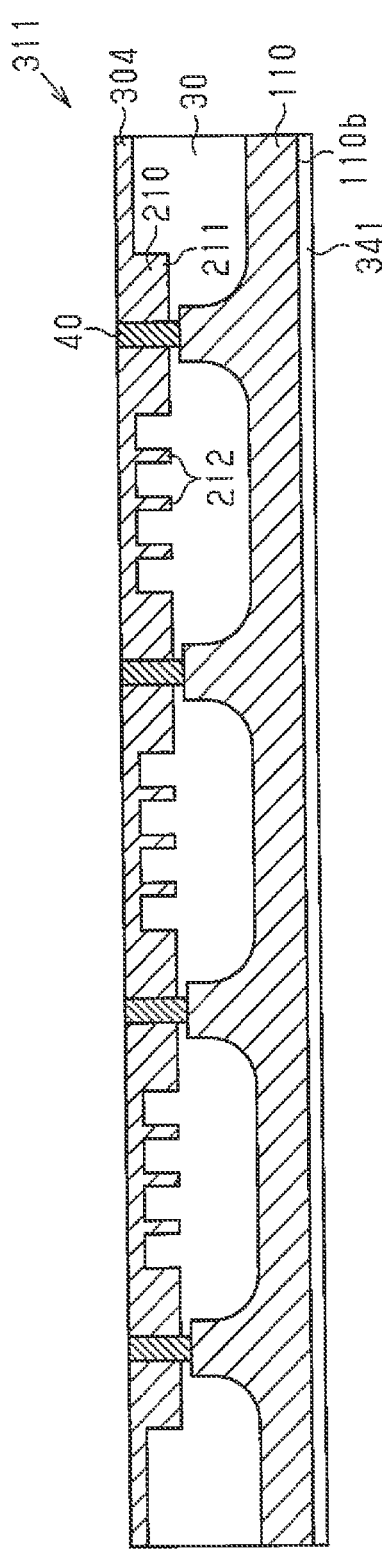
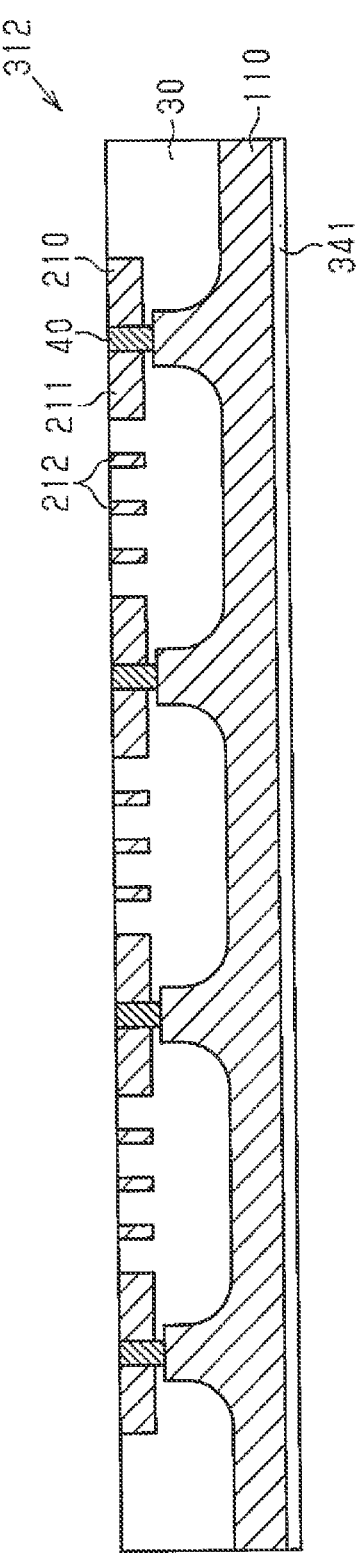
Fig.18A
Fig.18B

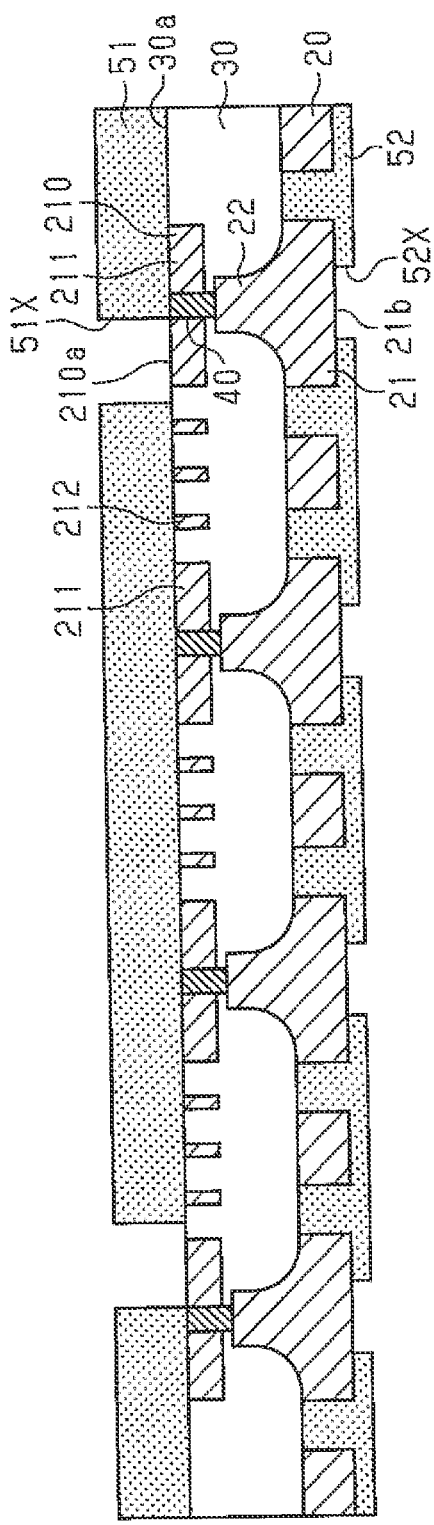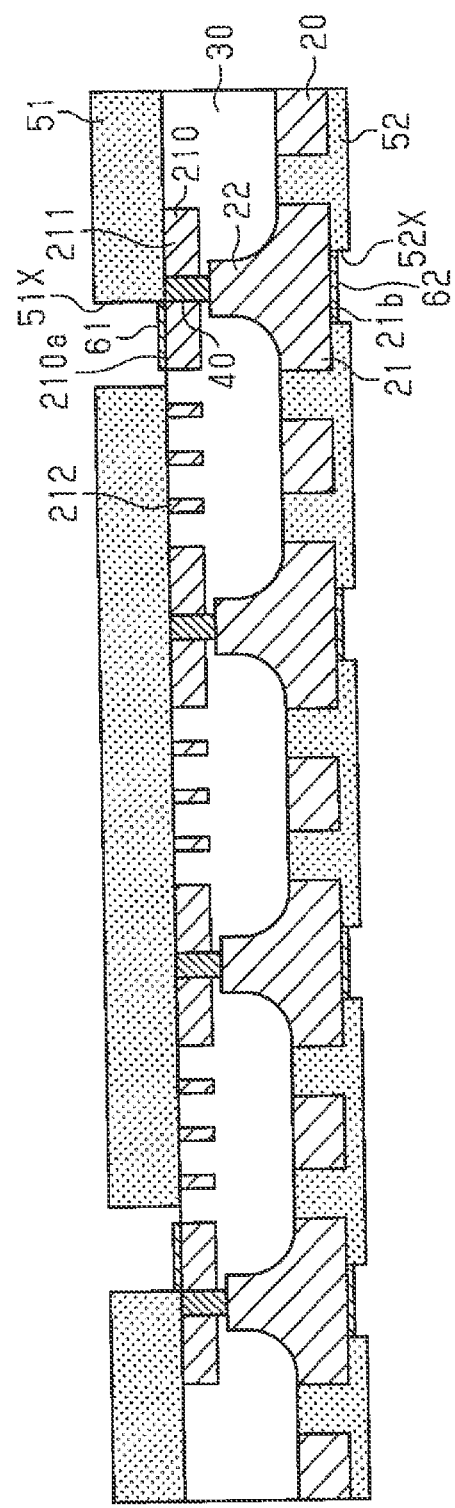

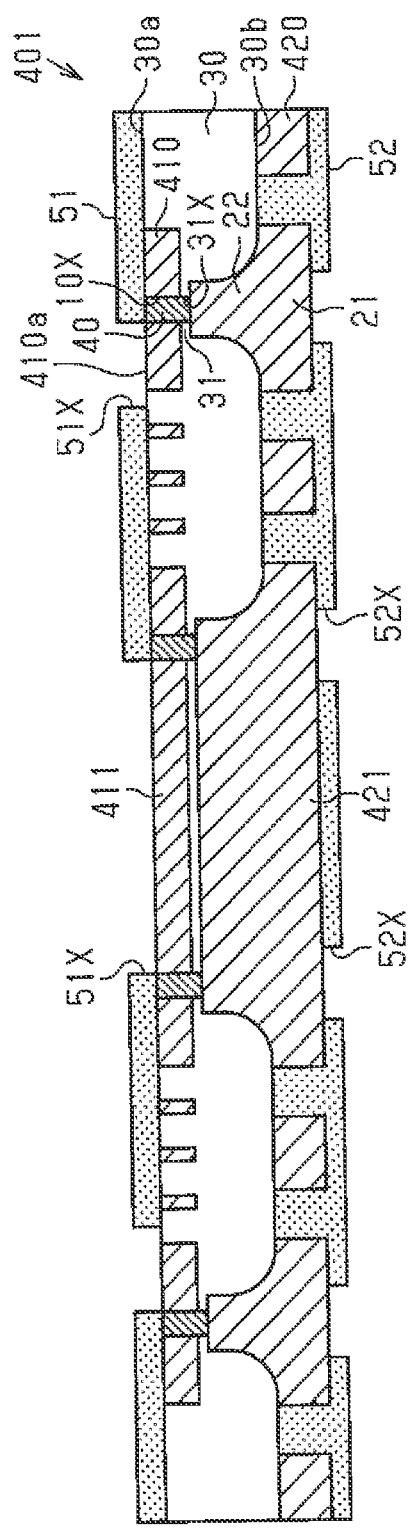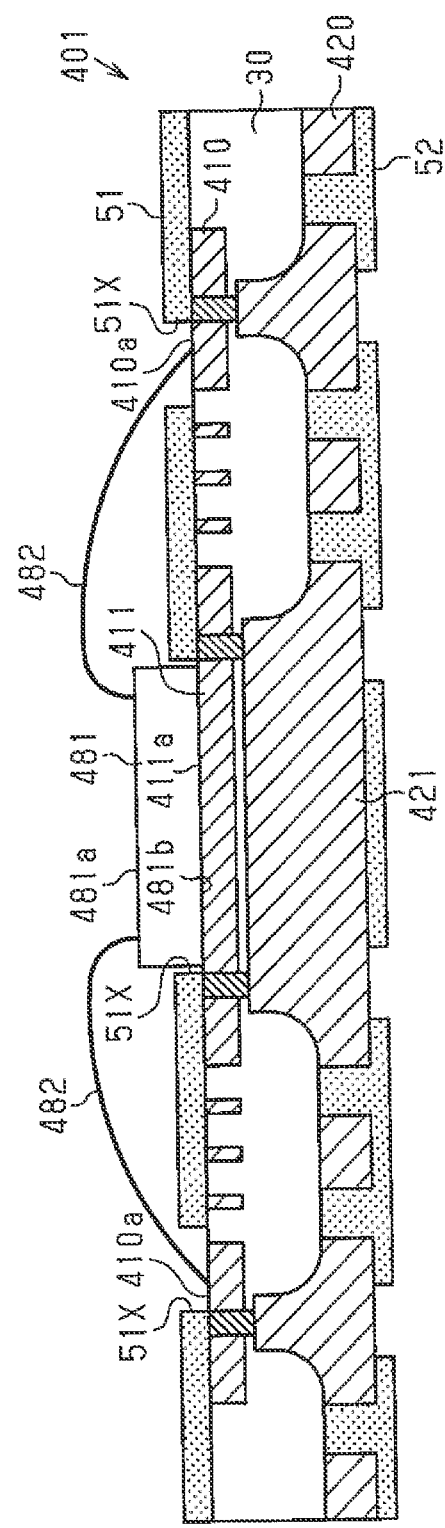
Fig.23A
Fig.23B

WIRING SUBSTRATE

CROSS-REFERENCE TO RELATED APPLICATIONS

This application is a divisional application of pending U.S. patent application Ser. No. 15/964,594 filed on Apr. 27, 2018, which claims the benefit of priority to Japanese Patent Application No. 2017-095240, filed on May 12, 2017, the entireties of both the above noted applications are incorporated herein by reference.

TECHNICAL FIELD

This disclosure relates to a wiring substrate and a method for manufacturing a wiring substrate.

BACKGROUND

Conventional thin wiring substrates include various types of wiring substrates, for example, on which an electronic component such as a semiconductor chip is mounted (refer to Japanese Laid-Open Patent Publication Nos. 11-298143 and 2009-194312).

SUMMARY

The reliability of a wiring substrate needs to be improved.

One embodiment is a wiring substrate. The wiring substrate includes an insulation layer, a first wiring layer, a second wiring layer, and a connection via. The first wiring layer is embedded in the insulation layer with an upper surface of the first wiring layer exposed from the insulation layer. The second wiring layer includes a terminal portion and an embedded portion. The terminal portion is located at a lower position than a lower surface of the insulation layer. The embedded portion is embedded in the insulation layer. The connection via connects the first wiring layer and the embedded portion of the second wiring layer. The insulation layer includes an extension between the embedded portion of the second wiring layer and a lower surface of the first wiring layer. The extension of the insulation layer includes a through hole extending through the extension in a thickness-wise direction. The connection via is located in the through hole extending through the extension.

Another embodiment is a method for manufacturing a wiring substrate. The method includes etching a first metal plate including a first surface and an opposite second surface from the first surface to form a first wiring layer in the first metal plate. The method also includes etching a second metal plate including a first surface and an opposite second surface from the first surface of the second metal plate to form a projection in the second metal plate. The method also includes arranging a semi-cured resin layer between the first metal plate and the second metal plate so that the first wiring layer faces an upper surface of the semi-cured resin layer and so that the projection faces a lower surface of the semi-cured resin layer. The method also includes forming an insulation layer in which the first wiring layer and the projection are embedded by pressing the first metal plate and the second metal plate toward the semi-cured resin layer and curing the semi-cured resin layer. The method also includes forming a through hole that extends through the first metal plate and the insulation layer and partially exposes an upper surface of the projection. The method also includes forming a connection via connecting the first metal plate and the second metal plate by forming a plating metal in the through hole through electrolytic plating. The method also includes etching the first metal plate from the second surface of the first metal plate so that the first wiring layer embedded in the insulation layer remains. The method further includes patterning the second metal plate from the second surface of the second metal plate to form a wiring portion located at a lower position than a lower surface of the insulation layer.

Another embodiment is a method for manufacturing a wiring substrate. The method includes preparing a support plate. The support plate includes a carrier plate and a metal foil laminated on a lower surface of the carrier plate with a delamination layer located in between. The method also includes forming a first wiring layer on a lower surface of the metal foil of the support plate through electrolytic plating. The method also includes etching a metal plate to form a projection in the metal plate. The method also includes arranging a semi-cured resin layer between the support plate and the metal plate so that the first wiring layer faces an upper surface of the semi-cured resin layer and so that the projection faces a lower surface of the semi-cured resin layer. The method also includes forming an insulation layer in which the first wiring layer and the projection are embedded by pressing the support plate and the metal plate toward the semi-cured resin layer and curing the semi-cured resin layer. The method also includes separating the carrier plate from the metal foil. The method also includes forming a through hole that extends through the metal foil, the first wiring layer, and the insulation layer and partially exposes an upper surface of the projection. The method also includes forming a connection via connecting the first wiring layer and the metal plate by forming a plating metal in the through hole through electrolytic plating. The method further includes removing the metal foil and patterning the metal plate to form a wiring portion located at a lower position than a lower surface of the insulation layer.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematic cross-sectional view illustrating a first embodiment of a wiring substrate;

FIG. 1B is a partially enlarged cross-sectional view of the wiring substrate illustrated in FIG. 1A;

FIGS. 3A to 3D, 4A to 4D, 5A, 5B, 6A to 6C, 7A, 7B, 8A, 8B, 9A to 9C, 10A, and 10B are schematic cross-sectional views illustrating a method for manufacturing the wiring substrate illustrated in FIG. 1A;

FIG. 11A is a schematic cross-sectional view illustrating a second embodiment of a wiring substrate;

FIG. 11B is a partially enlarged cross-sectional view of the wiring substrate illustrated in FIG. 11A;

FIGS. 12A, 12B, 13A, 13B, 14, 15A, 15B, 16A to 16C, 17A, 17B, 18A, 18B, 19A to 19C, 20A, and 20B are schematic cross-sectional views illustrating a method for manufacturing the wiring substrate illustrated in FIG. 11A;

FIG. 23A is a schematic cross-sectional view illustrating a modified example of a wiring substrate;

FIG. 23B is a schematic cross-sectional view of a semiconductor device including the wiring substrate illustrated in FIG. 23A;

DESCRIPTION OF THE EMBODIMENTS

Figure 2:
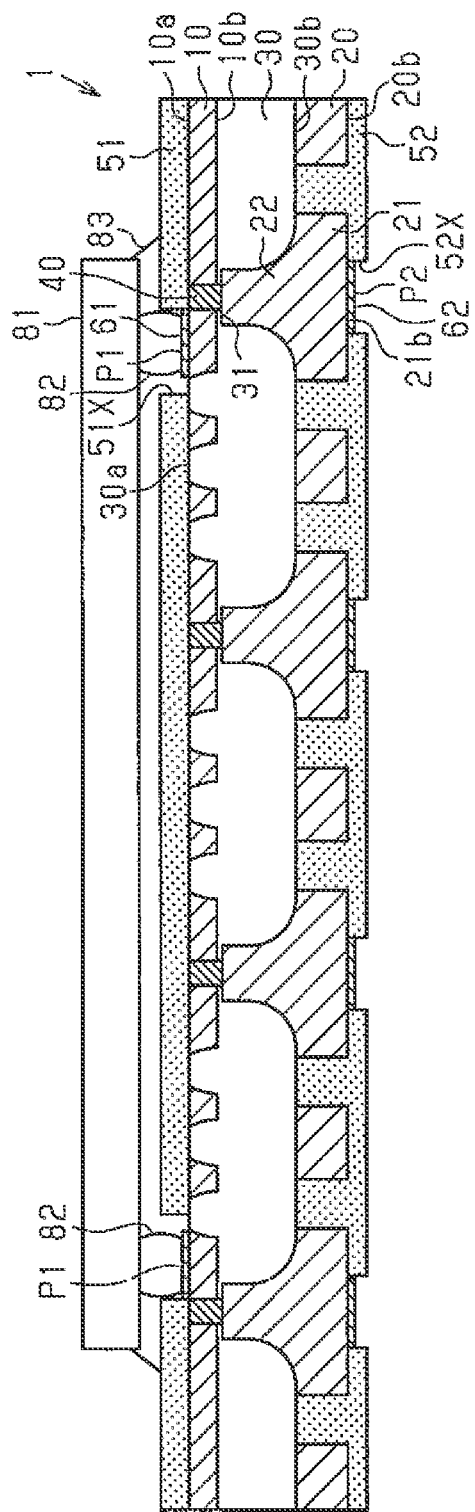
FIG. 2 is a schematic cross-sectional view of a semiconductor device including the wiring substrate illustrated in FIG. 1A.

Embodiments will now be described with reference to the accompanying drawings. Elements in the drawings may be partially enlarged and thus have not necessarily been drawn to scale. To facilitate understanding, hatching lines may not be illustrated or replaced by shadings in the cross-sectional drawings. The same reference characters are given to the same elements that are used in the embodiments. Such elements will not be described in detail. In the description hereafter, the "plan view" refers to the view of an object taken in the vertical direction (for example, upper-lower direction in FIG. 1A), and the "planar shape" refers to the shape of an object as viewed in the vertical direction.

First Embodiment

A wiring substrate 1 according to a first embodiment will now be described. As illustrated in FIG. 1A, the wiring substrate 1 includes a first wiring layer 10, a second wiring layer 20, an insulation layer 30, connection vias 40, solder resist layers 51 and 52, and surface-processed layers 61 and 62.

The insulation layer 30 is thin plate-shaped. The material of the insulation layer 30 may be, for example, a thermosetting resin. The thermosetting resin may be, for example, an epoxy resin, a polyimide resin, or a cyanate resin.

The first wiring layer 10 is located at the side of an upper surface 30a of the insulation layer 30. The first wiring layer 10 is embedded in the insulation layer 30. The first wiring layer 10 has an upper surface 10a exposed from the insulation layer 30. In the present embodiment, the upper surface 10a of the first wiring layer 10 and the upper surface 30a of the insulation layer 30 are located at the same height (i.e., same level).

As illustrated in FIG. 1B, the first wiring layer 10 has curved side surfaces 10c, each of which flares sideward from a lower surface 10b of the first wiring layer 10 toward the upper surface 10a. Thus, the cross section of the first wiring layer 10 in a plan view enlarges from the lower surface 10b of the first wiring layer 10 toward the upper surface 30a of the insulation layer 30. Further, the side surfaces 10c of the first wiring layer 10 are curved along the insulation layer 30 and concave toward an inner side of the first wiring layer 10 from the lower surface 10b to the upper surface 10a of the first wiring layer 10. The lower surface 10b and the side surfaces 10c of the first wiring layer 10 are in contact with the insulation layer 30.

As illustrated in FIG. 1A, the second wiring layer 20 is located at the side of a lower surface 30b of the insulation layer 30. The second wiring layer 20 includes wiring portions 21 and projections 22. Each of the wiring portions 21 is located at a lower position than the lower surface 30b of the insulation layer 30 and functions as a terminal portion. Each of the projections 22 is embedded in the insulation layer 30 and functions as an embedded portion.

As illustrated in FIG. 1B, the projection 22 has an upper surface 22a and a curved side surface 22b. The side surface 22b of the projection 22 flares sideward from the upper surface 22a of the projection 22 toward the wiring portion 21. Thus, the cross section of the projection 22 in a plan view enlarges from the upper surface 22a of the projection 22 toward the wiring portion 21. Further, the side surface 22b of the projection 22 is curved along the insulation layer 30 and concave toward an inner side of the projection 22 from the upper surface 22a of the projection 22 to the wiring portion 21. The side surface 22b and the upper surface 22a of the projection 22 are in contact with the insulation layer 30.

The upper surface 22a of the projection 22 of the second wiring layer 20 faces the lower surface 10b of the first wiring layer 10. The insulation layer 30 includes extensions 31 located in gaps between the lower surface 10b of the first wiring layer 10 and the upper surface 22a of each projection 22. The extensions 31 fill the gaps between the lower surface 10b of the first wiring layer 10 and the upper surface 22a of each projection 22. The extensions 31 are formed by portions of the insulation layer 30. The lower surface 10b of the first wiring layer 10 is spaced apart from the upper surface 22a of each projection 22 and thus does not contact the upper surface 22a.

Through holes 10X extend through the first wiring layer 10 in the vertical direction (i.e., thickness-wise direction) in desired positions. Through holes 31X extend through the respective extensions 31 of the insulation layer 30 in the vertical direction. Each of the through holes 31X is located at the same position as the corresponding through hole 10X of the first wiring layer 10 in a plan view. In the present embodiment, the through holes 10X and the through holes 31X have the same diameter.

The connection vias 40 are arranged in the through holes 10X of the first wiring layer 10 and the through holes 31X of the insulation layer 30. Each of the connection vias 40 includes via portions 41 and 42. The via portion 41 is located in the through hole 31X of the insulation layer 30 (extension 31) and functions as a connection portion. The via portion 42 is located in the through hole 10X of the first wiring layer 10 and functions as a through portion. The two via portions 41 and 42 are formed integrally with each other.

The lower surface of the connection via 40 (via portion 41) is connected to the upper surface 22a of the projection 22 of the second wiring layer 20. The circumferential surface of the via portion 41 is in contact with the wall surface of the through hole 31X in the insulation layer 30 (extension 31). The circumferential surface of the via portion 42 is connected to the wall surface of the through hole 10X in the first wiring layer 10. The material of the connection vias 40 may be, for example, copper (Cu) or a copper alloy. The connection vias 40 connect the first wiring layer 10 and the second wiring layer 20 to each other.

As illustrated in FIG. 1A, the solder resist layer 51 is formed on the upper surface 30a of the insulation layer 30 to partially cover the first wiring layer 10. The solder resist layer 51 includes openings 51X partially exposing the upper surface 10a of the first wiring layer 10.

The solder resist layer 52 is formed on the lower surface 30b of the insulation layer 30 to partially cover the second wiring layer 20. The solder resist layer 52 includes openings 52X partially exposing a lower surface 20b of the second wiring layer 20.

For example, a photosensitive dry film resist or liquid photoresist is used as the solder resist layer 51. The material of such a resist may be, for example, a novolac resin or an acrylic resin. For example, when a photosensitive dry film resist is used, the insulation layer 30 and the first wiring layer 10 are laminated with a dry film through thermocompression bonding, and the dry film is patterned through photolithography to form the solder resist layer 51 including the openings 51X. When a liquid photoresist is used, the solder resist layer 51 also may be formed through the same process.

The material of the solder resist layer 52 may be, for example, the same as the material of the solder resist layer 51, that is, a photosensitive dry film resist or a liquid photoresist (e.g., novolac resin or acrylic resin). For example, when a photosensitive dry film resist is used, the insulation layer 30 and the second wiring layer 20 are laminated with a dry film through thermocompression bonding, and the dry film is patterned through photolithography to form the solder resist layer 52 including the openings 52X. When a liquid photoresist is used, the solder resist layer 52 also may be formed through the same process. Alternatively, different materials may be used as the solder resist layers 51 and 52.

The surface-processed layer 61 is formed on the upper surface 10a of the first wiring layer 10 exposed in the openings 51X of the solder resist layer 51. The upper surface of the surface-processed layer 61 functions as external connection terminals P1 configured to be connected to an electronic component such as a semiconductor chip.

The surface-processed layer 61 may be, for example, a gold (Au) layer, a nickel (Ni) layer/Au layer (metal layer in which Au layer is formed on Ni layer serving as bottom layer), or an Ni layer/palladium (Pd) layer/Au layer (metal layer in which Ni layer serves as bottom layer and Ni layer, Pd layer, and Au layer are sequentially stacked). The surface-processed layer 61 may be formed by performing an anti-oxidation process such as an organic solderability preservative (OSP) process. For example, when an OSP process is performed, the surface-processed layer 61 is formed by an organic coating of, for example, an azole compound or an imidazole compound.

The surface-processed layer 62 is formed on a lower surface 21b of each wiring portion 21 of the second wiring layer 20 exposed in the openings 52X of the solder resist layer 52. The lower surface of the surface-processed layer 62 functions as external connection terminals P2 used to mount the wiring substrate 1 on another circuit board or the like.

The surface-processed layer 62 may be, for example, a gold (Au) layer, a nickel (Ni) layer/Au layer (metal layer in which Au layer is formed on Ni layer serving as bottom layer), or an Ni layer/palladium (Pd) layer/Au layer (metal layer in which Ni layer serves as bottom layer and Ni layer, Pd layer, and Au layer are sequentially stacked). The surface-processed layer 62 may be formed by performing an anti-oxidation process such as an organic solderability preservative (OSP) process. For example, when an OSP process is performed, the surface-processed layer 62 is formed by an organic coating of, for example, an azole compound or an imidazole compound.

As illustrated in FIG. 2, a semiconductor device includes the wiring substrate 1 and a semiconductor chip 81 (electronic component) mounted on the wiring substrate 1. The semiconductor chip 81 is connected to the external connection terminals P1 by bumps 82. The semiconductor chip 81 is flip-chip-connected to the wiring substrate 1. An underfill resin 83 is formed in the gap between the semiconductor chip 81 and the wiring substrate 1. The semiconductor chip 81 is, for example, a logic chip such as a CPU or a memory chip. The bumps 82 are, for example, solder bumps or gold bumps. The material of the solder bumps is, for example, a lead-containing alloy, an alloy of tin and gold, an alloy of tin and copper, an alloy of tin and silver, or an alloy of tin, silver, and copper. The material of the underfill resin 83 is, for example, an insulative resin such as an epoxy resin.

Wiring Substrate Manufacturing Method

A method for manufacturing the wiring substrate 1 will now be described. For the sake of brevity, portions that ultimately become elements of the wiring substrate 1 are indicated by reference characters indicating the final elements. Each drawing illustrates reference characters of elements necessary for the description and may not illustrate reference characters of elements that are not described.

Figure 3A:

As illustrated in FIG. 3A, a first metal plate 100 is prepared. The first metal plate 100 is used to form the first wiring layer 10 illustrated in FIG. 1A. The material of the first metal plate 100 may be, for example, copper (Cu) or a copper alloy. The thickness of the first metal plate 100 may be set to, for example, 50 to 70 μm. The thickness of the first metal plate 100 may be set, for example, to be equal to the thickness of each wiring portion 21 of the second wiring layer 20 illustrated in FIG. 1A.

Figure 3B:
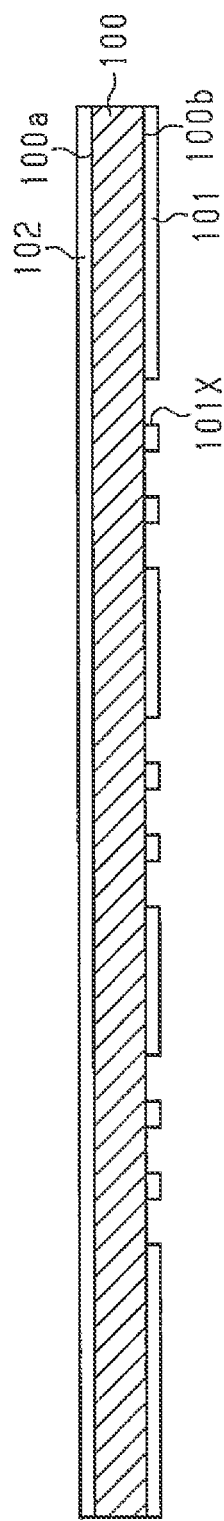

As illustrated in FIG. 3B, an etching mask 101 including openings 101X is formed on a lower surface 100b of the first metal plate 100. The etching mask 101 is formed on positions corresponding to the first wiring layer 10 illustrated in FIG. 1A.

The etching mask 101 is, for example, a resist layer. The material of the resist layer may have, for example, resistance to etching performed in the next step. For example, a photosensitive dry film resist or liquid photoresist is used as the resist layer. The material of such a resist layer may be, for example, a novolac resin or an acrylic resin. For example, when a photosensitive dry film resist is used, the lower surface 100b of the first metal plate 100 is laminated with a dry film through thermocompression bonding, and the dry film is patterned through exposure and development to form the etching mask 101. When a liquid photoresist is used, the etching mask 101 also may be formed through the same process.

A protective layer 102 is formed on an upper surface 100a of the first metal plate 100. The protective layer 102 protects the upper surface 100a of the first metal plate 100 during etching of the first metal plate 100 as described above. The material of the protective layer 102 may be, for example, the same as the material of the etching mask 101. Alternatively, different materials may be used as the etching mask 101 and the protective layer 102.

Figure 3C:
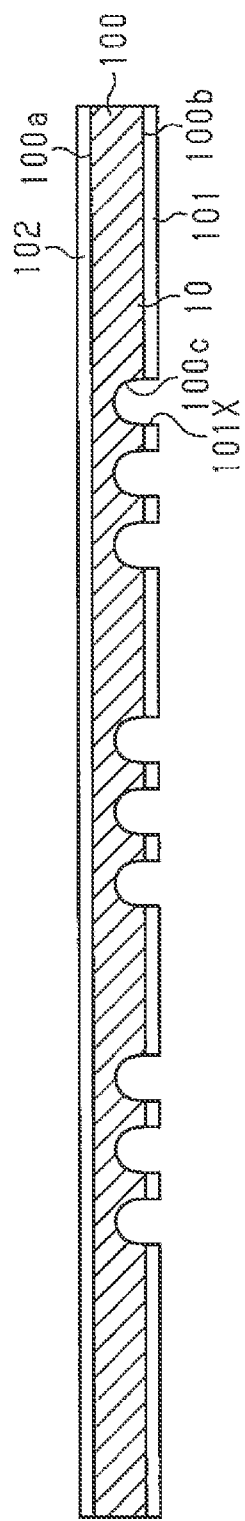

As illustrated in FIG. 3C, the first metal plate 100 is etched from the openings 101X of the etching mask 101 to form recesses 100c of desired depths in the first metal plate 100. When a copper plate is used as the first metal plate 100, a ferric chloride solution or a cupric chloride solution may be used as the etchant. For example, a spray etching machine may be used as the etching machine. Portions of the first metal plate 100 where the lower surface 100b remains after the etching, that is, portions covered by the etching mask 101, function as the first wiring layer 10 illustrated in FIG. 1A.

Figure 3D:
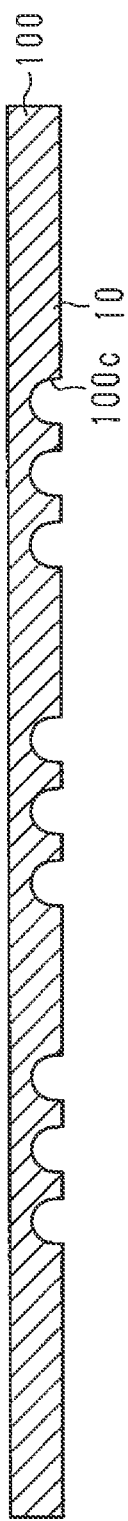

As illustrated in FIG. 3D, the etching mask 101 and the protective layer 102 (refer to FIG. 3C) are removed from the first metal plate 100. When a resist layer is used as the etching mask 101, the etching mask 101 may be removed through ashing or using an alkaline stripping solution. The protective layer 102 may be removed in the same manner as the etching mask 101. This obtains the first metal plate 100 including the first wiring layer 10.

As illustrated in FIG. 4A, a second metal plate 110 is prepared. The second metal plate 110 is used to form the second wiring layer 20 illustrated in FIG. 1A. The material of the second metal plate 110 may be, for example, copper (Cu) or a copper alloy. The thickness of the second metal plate 110 may be set to, for example, 100 to 150 μm.

As illustrated in FIG. 4B, an etching mask 111 including openings 111X is formed on an upper surface 110a of the second metal plate 110. The etching mask 111 is formed on positions corresponding to the projections 22 of the second wiring layer 20 illustrated in FIG. 1A.

The etching mask 111 is, for example, a resist layer. The material of the resist layer may have, for example, resistance to etching performed in the next step. For example, a photosensitive dry film resist or liquid photoresist is used as the resist layer. The material of such a resist layer may be, for example, a novolac resin or an acrylic resin. For example, when a photosensitive dry film resist is used, the upper surface 110a of the second metal plate 110 is laminated with a dry film through thermocompression bonding, and the dry film is patterned through exposure and development to form the etching mask 111. When a liquid photoresist is used, the etching mask 111 also may be formed through the same process.

A protective layer 112 is formed on a lower surface 110b of the second metal plate 110. The protective layer 112 protects the lower surface 110b of the second metal plate 110 during etching of the second metal plate 110 as described above. The material of the protective layer 112 may be, for example, the same as the material of the etching mask 111. Alternatively, different materials may be used as the etching mask 111 and the protective layer 112.

As illustrated in FIG. 4C, the second metal plate 110 is etched from the openings 111X of the etching mask 111 to form recesses 110c of desired depths in the second metal plate 110. When a copper plate is used as the second metal plate 110, a ferric chloride solution or a cupric chloride solution may be used as the etchant. For example, a spray etching machine may be used as the etching machine. Portions of the second metal plate 110 where the upper surface 110a remains after the etching, that is, portions covered by the etching mask 111, function as the projections 22 of the second wiring layer 20 illustrated in FIG. 1A.

As illustrated in FIG. 4D, the etching mask 111 and the protective layer 112 (refer to FIG. 4C) are removed from the second metal plate 110. When a resist layer is used as the etching mask 111, the etching mask 111 may be removed through ashing or using an alkaline stripping solution. The protective layer 112 may be removed in the same manner as the etching mask 111. This obtains the second metal plate 110 including the projections 22.

As illustrated in FIG. 5A, a mold sheet 120 is prepared. The mold sheet 120 may be a semi-cured thermosetting resin layer. The material of the semi-cured resin layer may be, for example, a thermosetting epoxy resin or a thermosetting polyolefin resin but is not limited to these resins. Alternatively, a semi-cured resin layer containing an inorganic filler such as silica particles may be used as the mold sheet 120. The inorganic filler may be alumina particles or silicon carbide particles. Further, multiple kinds of particles may be used. The material of the mold sheet 120 may be a resin other than those described above.

As illustrated in FIG. 5A, the mold sheet 120 has an upper surface 120a and a lower surface 120b. The mold sheet 120 is arranged between the first metal plate 100 and the second metal plate 110 so that the first wiring layer 10 faces the upper surface 120a and so that the projections 22 face the lower surface 120b.

As illustrated in FIG. 5B, for example, the first metal plate 100 and the second metal plate 110 are pressed toward the mold sheet 120 in a vacuum atmosphere. The mold sheet 120 is heated and cured at a given temperature (for example, 190° C. to 230° C.) to form the insulation layer 30. This step obtains a structural body 130. The structural body 130 includes the insulation layer 30, the first metal plate 100 formed at the side of the upper surface 30a (refer to FIG. 1A) of the insulation layer 30, and the second metal plate 110 formed at the side of the lower surface 30b of the insulation layer 30. The first wiring layer 10 of the first metal plate 100 is embedded in the insulation layer 30 at the side of the upper surface 30a. The projections 22 of the second metal plate 110 are embedded in the insulation layer 30 at the side of the lower surface 30b. Portions of the insulation layer 30 sandwiched between the lower surface 100b of the first metal plate 100 and the upper surfaces 22a of the projections 22 of the second metal plate 110 function as the extensions 31.

Figure 6A:
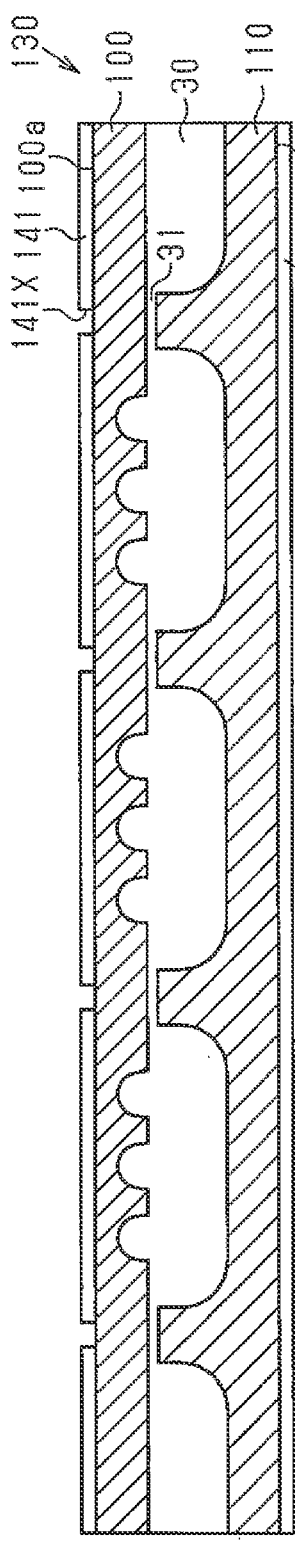

As illustrated in FIG. 6A, an etching mask 141 including openings 141X is formed on the upper surface 100a of the first metal plate 100. The openings 141X of the etching mask 141 are formed in positions corresponding to the through holes 10X of the first wiring layer 10 illustrated in FIG. 1A. For example, a resist layer may be used as the etching mask 141 in the same manner as the etching masks 101 and 111 described above.

A protective layer 142 is formed on the lower surface 110b of the second metal plate 110. The protective layer 142 covers the entire lower surface 110b of the second metal plate 110. The material of the protective layer 142 may be, for example, the same as the material of the etching mask 141. Alternatively, different materials may be used as the etching mask 141 and the protective layer 142.

Figure 6B:
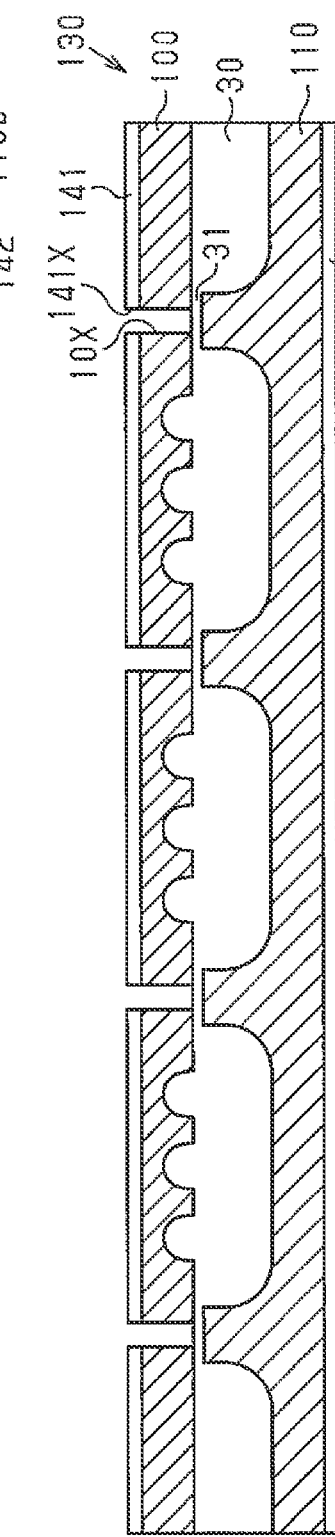

As illustrated in FIG. 6B, the first metal plate 100 is etched from the openings 141X of the etching mask 141 to form the through holes 10X extending through the first metal plate 100. In the same manner as the etching described above, in the etching forming the through holes 10X, a ferric chloride solution or a cupric chloride solution may be used as the etchant. A spray etching machine may be used as the etching machine.

Figure 6C:
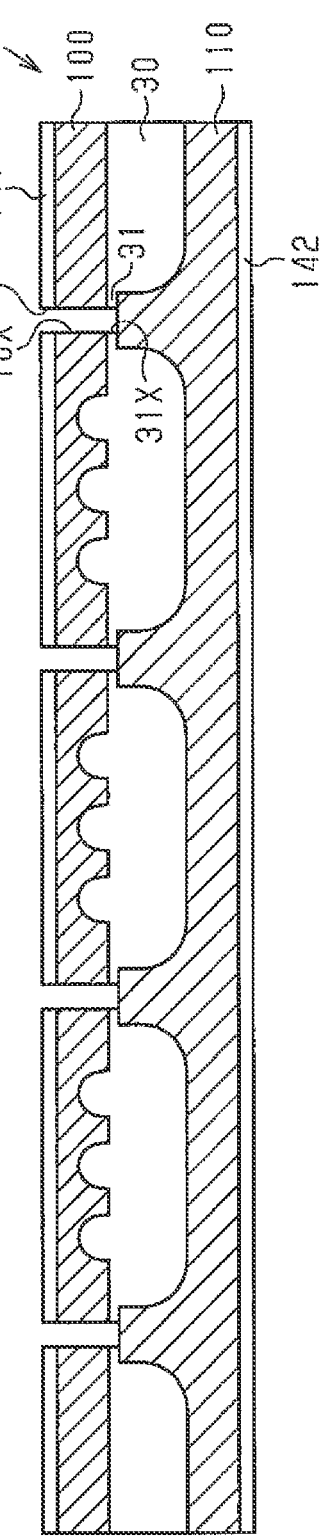

As illustrated in FIG. 6C, the through holes 31X are formed in the extensions 31 of the insulation layer 30 exposed in the openings 141X of the etching mask 141. A conventional resin removing process may be used to form the through holes 31X. The resin removing process is, for example, a desmear process using a potassium permanganate solution or a laser drilling using a $CO_2$ laser.

As illustrated in FIG. 7A, a resist layer 151 including openings 151X is formed to cover the upper surface 100a of the first metal plate 100. A resist layer 152 is formed to cover the entire lower surface 110b of the second metal plate 110.

The material of the resist layers 151 and 152 may have resistance to plating performed in the next step. For example, a photosensitive dry film resist (e.g., novolac resin or acrylic resin) may be used as the resist layers 151 and 152. The upper surface 100a of the first metal plate 100 and the lower surface 110b of the second metal plate 110 are, for example, laminated with dry films through thermocompression bonding, and the dry films are patterned through exposure and development to form the resist layers 151 and 152. When the etching mask 141 and the protective layer 142 used in the etching illustrated in FIGS. 6B and 6C are not removed, the etching mask 141 and the protective layer 142 may be used as the resist layers 151 and 152.

As illustrated in FIG. 7A, electrolytic plating is performed on the structural body 130 with the second metal plate 110 serving as the plating power feeding layer. Electrolytic plating allows an electrolytic plating film 153 (plating metal) to gradually deposit and grow on the upper surfaces 22a of the projections 22 of the second metal plate 110 exposed in the through holes 10X and 31X. In the present example, the electrolytic plating film 153 is a copper plating film. Since the extensions 31 of the insulation layer 30 are thin, the electrolytic plating film 153 also deposits and grows on the wall surfaces of the through holes 10X in the first metal plate 100. Consequently, as illustrated in FIG. 7B, the through holes 10X and 31X are filled with the electrolytic plating film 153. The electrolytic plating film 153 connects the projections 22 of the second metal plate 110 to the first metal plate 100. The electrolytic plating film 153, which fills the through holes 10X and 31X, is formed as the connection vias 40 illustrated in FIG. 1A.

The resist layers 151 and 152 are removed. For example, an alkaline stripping solution is used to remove the resist layers 151 and 152.

In the present embodiment, the connection vias 40 are formed, for example, by a plating metal (electrolytic plating film 153) and do not include a seed layer. For example, when a copper clad core in which copper foils are applied to two opposite surfaces of an insulation layer is used to manufacture a wiring substrate, in order to form connection vias in through holes of the insulation layer, a seed layer needs to be formed on wall surfaces of the through holes in the insulation layer. In this regard, in the manufacturing process of the present embodiment, a seed layer does not need to be formed. This shortens the manufacturing time.

As illustrated in FIG. 8A, a protective layer 161 is formed on the lower surface 110b of the second metal plate 110. The protective layer 161 covers the entire lower surface 110b of the second metal plate 110. The protective layer 161 is, for example, a resist layer. The material of the resist layer may have, for example, resistance to etching performed in the next step. For example, a photosensitive dry film resist or liquid photoresist is used as the resist layer. The material of such a resist may be, for example, a novolac resin or an acrylic resin. For example, when a photosensitive dry film resist is used, the lower surface 110b of the second metal plate 110 is laminated with a dry film through thermocompression bonding, and the dry film is patterned through exposure and development to form the protective layer 161. When a liquid photoresist is used, the protective layer 161 also may be formed through the same process.

The first metal plate 100 is etched from the upper surface 100a. As illustrated in FIG. 8B, this obtains a structural body 131 including the first wiring layer 10 embedded in the insulation layer 30. When the first metal plate 100 is etched from the upper surface 100a as described above, the first wiring layer 10 embedded in the insulation layer 30 remains.

When a copper plate is used as the first metal plate 100, a ferric chloride solution or a cupric chloride solution may be used as the etchant, and a spray etching machine may be used as the etching machine. Subsequently, the protective layer 161 is removed. When a resist layer is used as the protective layer 161, the protective layer 161 may be removed, for example, by an alkaline stripping solution.

Figure 9A:
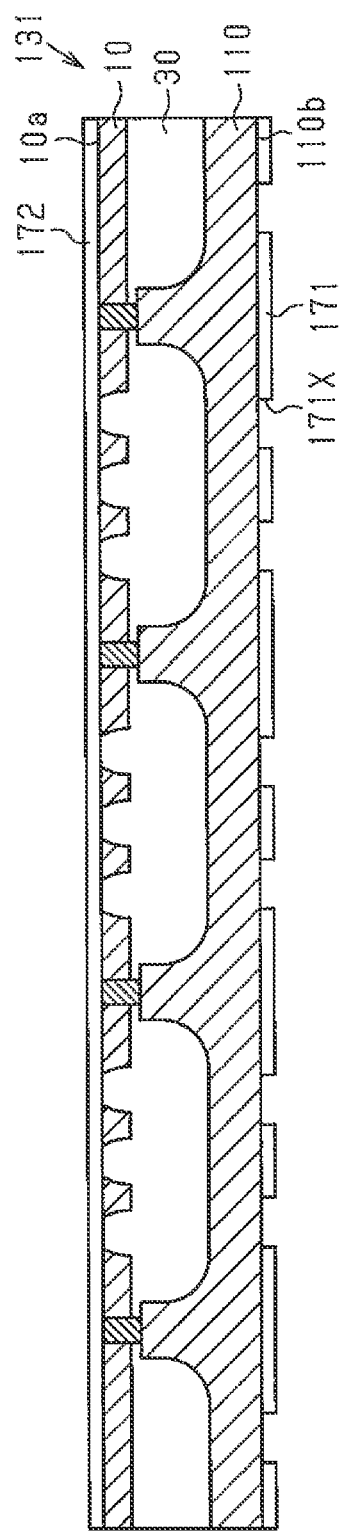

As illustrated in FIG. 9A, an etching mask 171 including openings 171X is formed on the lower surface 110b of the second metal plate 110. The etching mask 171 is formed on positions corresponding to the wiring portions 21 of the second wiring layer 20 illustrated in FIG. 1A. In the same manner as the etching masks described above, the material of the etching mask 171 may have resistance to etching performed in the next step. Additionally, a protective layer 172 covers the upper surface of the structural body 131, that is, the insulation layer 30 and the first wiring layer 10. In the same manner as the protective layers described above, the material of the protective layer 172 may have resistance to etching performed in the next step.

Figure 9B:
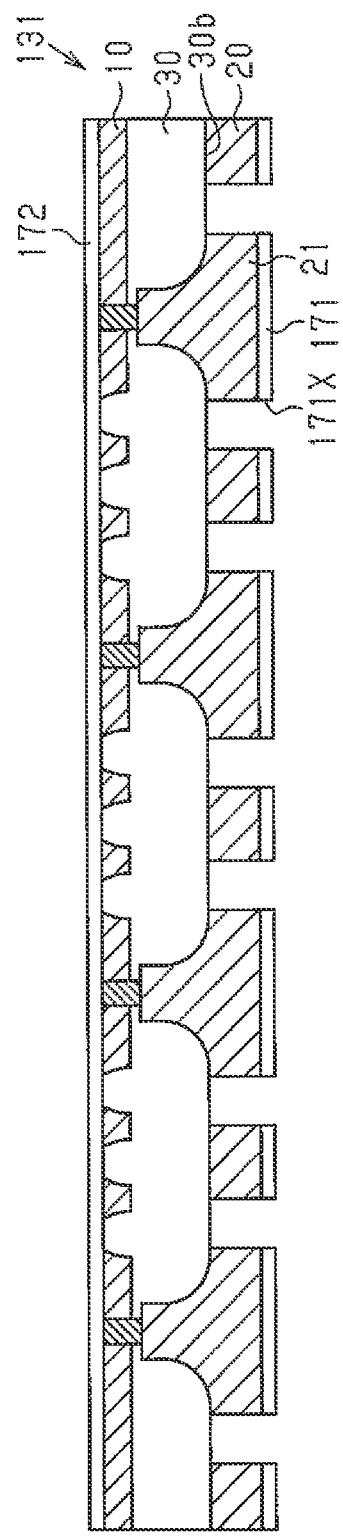

As illustrated in FIG. 9B, the second metal plate 110 is etched from the openings 171X of the etching mask 171 to form through holes exposing the lower surface 30b of the insulation layer 30. This forms the wiring portions 21 of the second wiring layer 20.

Figure 9C:
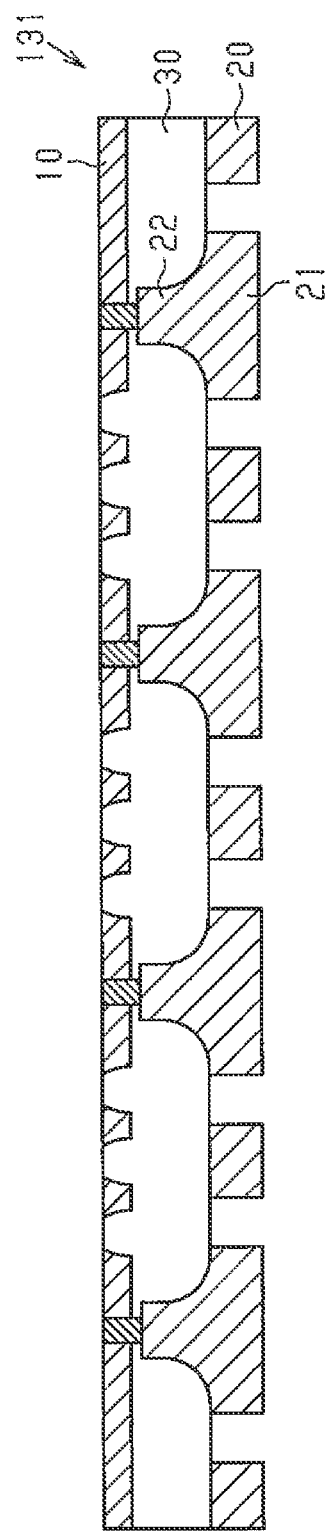

As illustrated in FIG. 9C, the etching mask 171 and the protective layer 172 (refer to FIG. 9B) are removed. When resist layers are used as the etching mask 171 and the protective layer 172, the etching mask 171 and the protective layer 172 may be removed, for example, by an alkaline stripping solution.

As illustrated in FIG. 10A, the solder resist layer 51 including the openings 51X and the solder resist layer 52 including the openings 52X are formed. Each of the openings 51X of the solder resist layer 51 partially exposes the upper surface 10a of the first wiring layer 10. Each of the openings 52X of the solder resist layer 52 partially exposes the lower surface 21b of the wiring portion 21 of the second wiring layer 20. The solder resist layer 51 is obtained, for example, by laminating with a photosensitive resin film or applying a resin liquid or paste and exposing and developing the resin through photolithography to be patterned into a desired shape. In the same manner, the solder resist layer 52 is obtained, for example, by laminating a photosensitive resin film or applying a resin liquid or paste and exposing and developing the resin through photolithography to be patterned into a desired shape.

As illustrated in FIG. 10B, the surface-processed layer 61 is formed on the upper surface 10a of the first wiring layer 10 exposed in the openings 51X of the solder resist layer 51. For example, when the surface-processed layer 61 is an Ni layer/Au layer, an Ni layer is formed on the upper surface 10a of the first wiring layer 10, and an Au layer is formed on the Ni layer to form the surface-processed layer 61. The Ni layer and the Au layer may be formed, for example, through electroless plating.

Also, the surface-processed layer 62 is formed on the lower surfaces 21b of the wiring portions 21 of the second wiring layer 20 exposed in the openings 52X of the solder resist layer 52. For example, when the surface-processed layer 62 is an Ni layer/Au layer, an Ni layer is formed on the lower surfaces 21b of the wiring portions 21, and an Au layer is formed on the Ni layer to form the surface-processed layer 62. The Ni layer and the Au layer may be formed, for example, through electroless plating.

The first embodiment has the advantages described below.

(1-1) The wiring substrate 1 includes the first wiring layer 10 embedded in the insulation layer 30 at the side of the upper surface 30a of the insulation layer 30. The first wiring layer 10 is more resistant to separation from the insulation layer 30 than a wiring layer that is formed on the upper surface of an insulation layer without being embedded in the insulation layer. This improves the reliability of the wiring substrate 1.

(1-2) The wiring substrate 1 includes the second wiring layer 20 located at the side of the lower surface 30b of the insulation layer 30. The second wiring layer 20 includes the wiring portions 21, which are located at lower positions than the lower surface 30b of the insulation layer 30, and the projections 22, which are embedded in the insulation layer 30. The second wiring layer 20 is more resistant to separation from the insulation layer 30 than a wiring layer that is formed on the lower surface of an insulation layer without being embedded in the insulation layer. This improves the reliability of the wiring substrate 1. Additionally, the embedment of the projections 22 in the insulation layer 30 allows formation of wiring on the lower surface 30b of the insulation layer 30 using the second wiring layer 20.

(1-3) The first wiring layer 10 and the second wiring layer 20 are connected by the connection vias 40. The connection vias 40 are formed in the through holes 10X of the first wiring layer 10 and the through holes 31X of the extensions 31. The extensions 31 are located between the first wiring layer 10 and the projections 22 of the second wiring layer 20. The first wiring layer 10 and the projections 22 of the second wiring layer 20 adhere to each other with the extensions 31. This limits separation of the wiring portions 21 and the projections 22 from the insulation layer 30 and improves the reliability of the wiring substrate 1.

(1-4) In the manufacturing process of the wiring substrate 1, the thickness of the first metal plate 100 is equal to the thickness of each wiring portion 21 formed in the second metal plate 110. Thus, in the structural body 130 (refer to FIG. 5B) in which the mold sheet 120 is sandwiched between the first metal plate 100 and the second metal plate 110, the thickness of the first metal plate 100 formed on the upper surface of the mold sheet 120 is equal to the thickness of the second metal plate 110 formed on the lower surface of the mold sheet 120. This limits bending of the structural body 130.

Second Embodiment

A wiring substrate 201 according to a second embodiment will now be described. In the second embodiment, the same reference characters are given to those elements that are the same as the corresponding elements of the first embodiment. Such elements may not be described in detail.

As illustrated in FIG. 11A, the wiring substrate 201 includes a first wiring layer 210, the second wiring layer 20, the insulation layer 30, the connection vias 40, the solder resist layers 51 and 52, and the surface-processed layers 61 and 62.

The insulation layer 30 is thin plate-shaped. The material of the insulation layer 30 may be, for example, a thermosetting resin. The thermosetting resin may be, for example, an epoxy resin, a polyimide resin, or a cyanate resin.

The first wiring layer 210 is located at the side of the upper surface 30a of the insulation layer 30. The first wiring layer 210 is embedded in the insulation layer 30. The first wiring layer 210 has an upper surface 210a exposed from the insulation layer 30. In the second embodiment, the upper surface 210a of the first wiring layer 210 and the upper surface 30a of the insulation layer 30 are located at the same height (i.e., same level).

Figure 21:
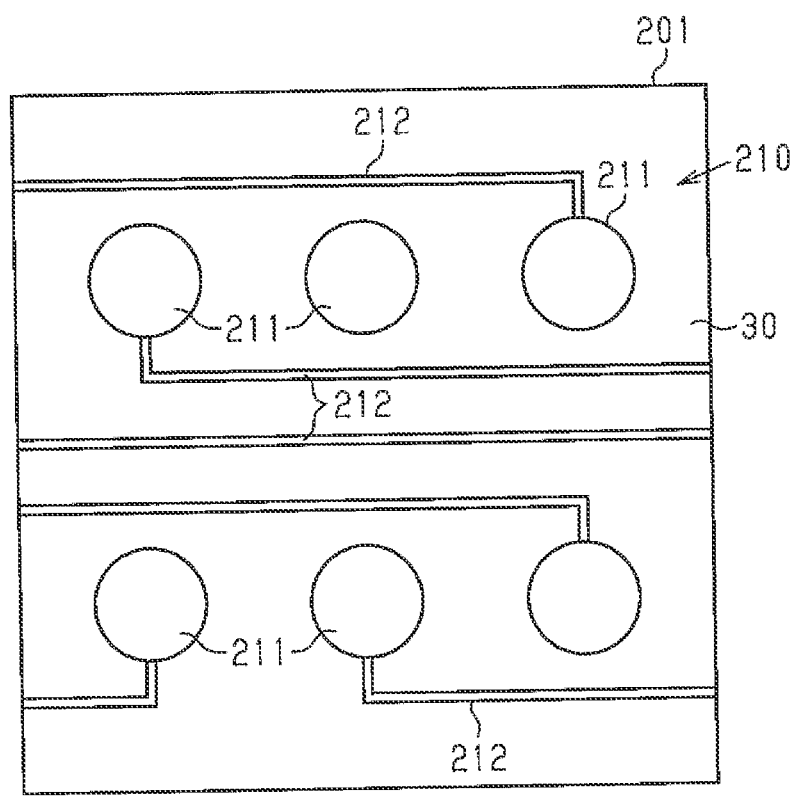
FIG. 21 is a partially enlarged plan view of the wiring substrate illustrated in FIG. 11A.

As illustrated in FIG. 21, the first wiring layer 210 includes pad portions 211 and wiring portions 212. The pad portions 211 are each circular in a plan view. The wiring portions 212 are connected to the pad portions 211. The width of each wiring portion 212 may be set to, for example, 30 μm.

As illustrated in FIG. 11B, each of the pad portions 211 has a side surface 211c extending in the vertical direction. In the same manner, each of the wiring portions 212 has a side surface 212c extending in the vertical direction. Each of the side surfaces 211c and 212c is, for example, orthogonal to the upper surface 30a of the insulation layer 30. Each of the pad portions 211 has a lower surface 211b. The side surfaces 211c and the lower surfaces 211b of the pad portions 211 are in contact with the insulation layer 30. In the same manner, each of the wiring portions 212 has a lower surface 212b, and the side surfaces 212c and the lower surfaces 212b of the wiring portions 212 are in contact with the insulation layer 30.

As illustrated in FIG. 11A, the second wiring layer 20 is located at the side of the lower surface 30b of the insulation layer 30. The second wiring layer 20 includes the wiring portions 21 (terminal portions), which are located at lower positions than the lower surface 30b of the insulation layer 30, and the projections 22 (embedded portions), which are embedded in the insulation layer 30.

As illustrated in FIG. 11B, the projection 22 has the side surface 22b that flares sideward from the upper surface 22a of the projection 22 toward the wiring portion 21. Thus, the cross section of the projection 22 in a plan view enlarges from the upper surface 22a of the projection 22 toward the wiring portion 21. Further, the side surface 22b of the projection 22 is curved along the insulation layer 30 and concave toward an inner side of the projection 22 from the upper surface 22a of the projection 22 to the wiring portion 21. The side surface 22b and the upper surface 22a of the projection 22 are in contact with the insulation layer 30.

The upper surface 22a of the projection 22 of the second wiring layer 20 faces the lower surface 211b of the pad portion 211 of the first wiring layer 210. The extension 31 of the insulation layer 30 is located in the gap between the upper surface 22a of the projection 22 and the lower surface 211b of the first wiring layer 210. The extension 31 fills the gap between the upper surface 22a of the projection 22 and the lower surface 211b of the first wiring layer 210. The extension 31 is formed by a portion of the insulation layer 30. The lower surface 211b of the first wiring layer 210 is spaced apart from the upper surface 22a of each projection 22 and thus does not contact the upper surface 22a.

The pad portions 211 of the first wiring layer 210 include through holes 211X extending through the pad portions 211 (i.e., first wiring layer 210) in the vertical direction in desired positions.

The through holes 31X extend through the extensions 31 of the insulation layer 30 in the vertical direction. Each of the through holes 31X is located at the same position as the corresponding through hole 211X of the first wiring layer 210 in a plan view. The connection vias 40 are located in the through holes 211X of the first wiring layer 210 (pad portions 211) and the through holes 31X of the insulation layer 30 (extensions 31). Each of the connection vias 40 includes the via portion 41 (connection portion) located in the through hole 31X of the extension 31 of the insulation layer 30 and the via portion 42 (through portion) located in the through hole 211X of the pad portion 211 of the first wiring layer 210. The two via portions 41 and 42 are formed integrally with each other.

The lower surface of the connection via 40 (via portion 41) is connected to the upper surface 22a of the projection 22 of the second wiring layer 20. The circumferential surface of the via portion 41 is in contact with the wall surface of the through hole 31X of the insulation layer 30 (extension 31). The circumferential surface of the via portion 42 is connected to the wall surface of the through hole 211X of the pad portion 211 of the first wiring layer 210. The material of the connection via 40 may be, for example, copper (Cu) or a copper alloy. The connection vias 40 connect the first wiring layer 210 and the second wiring layer 20 to each other.

As illustrated in FIG. 11A, the solder resist layer 51 is formed on the upper surface 30a of the insulation layer 30 to partially cover the first wiring layer 210. The solder resist layer 51 includes the openings 51X partially exposing the upper surface 210a of the first wiring layer 210.

The solder resist layer 52 is formed on the lower surface 30b of the insulation layer 30 to partially cover the second wiring layer 20. The solder resist layer 52 includes the openings 52X partially exposing the lower surface 20b of the second wiring layer 20.

For example, a photosensitive dry film resist or liquid photoresist is used as the solder resist layer 51. The material of such a resist may be, for example, a novolac resin or an acrylic resin. For example, when a photosensitive dry film resist is used, the insulation layer 30 and the first wiring layer 210 are laminated with a dry film through thermocompression bonding, and the dry film is patterned through photolithography to form the solder resist layer 51 including the openings 51X. When a liquid photoresist is used, the solder resist layer 51 also may be formed through the same process.

The material of the solder resist layer 52 may be, for example, the same as the material of the solder resist layer 51, that is, a photosensitive dry film resist or a liquid photoresist (e.g., novolac resin or acrylic resin). For example, when a photosensitive dry film resist is used, the insulation layer 30 and the second wiring layer 20 are laminated with a dry film through thermocompression bonding, and the dry film is patterned through photolithography to form the solder resist layer 52 including the openings 52X. When a liquid photoresist is used, the solder resist layer 52 also may be formed through the same process. Alternatively, different materials may be used as the solder resist layers 51 and 52.

The surface-processed layer 61 is formed on the upper surface 210a of the first wiring layer 210 exposed in the openings 51X of the solder resist layer 51. The upper surface of the surface-processed layer 61 function as the external connection terminals P1 configured to be connected to an electronic component such as a semiconductor chip.

The surface-processed layer 61 may be, for example, a gold (Au) layer, a nickel (Ni) layer/Au layer (metal layer in which Au layer is formed on Ni layer serving as bottom layer), or an Ni layer/palladium (Pd) layer/Au layer (metal layer in which Ni layer serves as bottom layer and Ni layer, Pd layer, and Au layer are sequentially stacked). The surface-processed layer 61 may be formed by performing an anti-oxidation process such as an organic solderability preservative (OSP) process. For example, when an OSP process is performed, the surface-processed layer 61 is formed by an organic coating of, for example, an azole compound or an imidazole compound.

The surface-processed layer 62 is formed on the lower surfaces 21b of the wiring portions 21 of the second wiring layer 20 exposed in the openings 52X of the solder resist layer 52. The lower surface of the surface-processed layer 62 functions as the external connection terminals P2 used to mount the wiring substrate 201 on another circuit board or the like.

The surface-processed layer 62 may be, for example, a gold (Au) layer, a nickel (Ni) layer/Au layer (metal layer in which Au layer is formed on Ni layer serving as bottom layer), or an Ni layer/palladium (Pd) layer/Au layer (metal layer in which Ni layer serves as bottom layer and Ni layer, Pd layer, and Au layer are sequentially stacked). The surface-processed layer 62 may be formed by performing an anti-oxidation process such as an OSP process. For example, when an OSP process is performed, the surface-processed layer 62 is formed by an organic coating of, for example, an azole compound or an imidazole compound.

Wiring Substrate Manufacturing Method

A method for manufacturing the wiring substrate 201 will now be described.

As illustrated in FIG. 12A, a support body 301 has an upper surface 301a and a lower surface 301b. Carrier-added metal foils 302 are formed on the upper surface 301a and the lower surface 301b to function as support plates. The support body 301 may be, for example, a semi-cured resin layer. The semi-cured resin layer may be, for example, a thermosetting epoxy resin or a thermosetting polyolefin resin but is not limited to these resins. Alternatively, a semi-cured resin layer containing an inorganic filler such as silica particles may be used as the support body 301. The inorganic filler may be alumina particles or silicon carbide particles. Further, multiple kinds of particles may be used. The material of the support body 301 may be a resin other than those described above.

Each of the carrier-added metal foils 302 includes a carrier plate 303 and an ultrathin metal foil 304, which is formed on one surface of the carrier plate 303 with a delamination layer (not illustrated) located in between. The thickness of the carrier plate 303 is, for example, 35 μm. The material of the carrier plate 303 may be, for example, copper or a copper alloy. The thickness of the metal foil 304 is, for example, 5 μm. The material of the metal foil 304 may be, for example, copper or a copper alloy.

The two carrier-added metal foils 302 are located on two opposite surfaces of the support body 301 so that each of the carrier plates 303 faces the support body 301. The two carrier-added metal foils 302 are, for example, pressed toward the support body 301 at a given pressure in a vacuum atmosphere. The support body 301 is heated and cured at a given temperature (for example, 190° C. to 230° C.).

As illustrated in FIG. 12B, a resist layer 305 including openings 305X is formed on the upper surface of the metal foil 304 of the carrier-added metal foil 302 located at the upper side of the support body 301. In the same manner, a resist layer 305 including openings 305X is formed on the lower surface of the metal foil 304 of the carrier-added metal foil 302 located at the lower side of the support body 301. The material of the resist layers 305 may have, for example, resistance to plating performed in the next step. For example, a photosensitive dry film resist (e.g., novolac resin or acrylic resin) may be used as the resist layers 305. The surface of each metal foil 304 is, for example, laminated with a dry film through thermocompression bonding, and the dry film is patterned through photolithography to form the resist layer 305. Alternatively, a liquid photoresist (e.g., novolac resin or acrylic resin) may be used to form the resist layer 305.

As illustrated in FIG. 13A, electrolytic plating is performed on the upper surface of the metal foil 304 of the carrier-added metal foil 302 that is located at the upper side of the support body 301 to form the first wiring layer 210. In the same manner, electrolytic plating is performed on the lower surface of the metal foil 304 of the carrier-added metal foil 302 that is located at the lower side of the support body 301 to form the first wiring layer 210. In the present example, electrolytic copper plating is performed on each of the carrier-added metal foils 302 in which the resist layer 305 serves as the plating mask and the metal foil 304 serves as the power feeding layer. This forms the first wiring layers 210 on the surfaces of the metal foils 304 exposed in the openings 305X of the resist layers 305. Subsequently, as illustrated in FIG. 13B, the resist layers 305 are removed, for example, through ashing or using an alkaline stripping solution.

Figure 14:
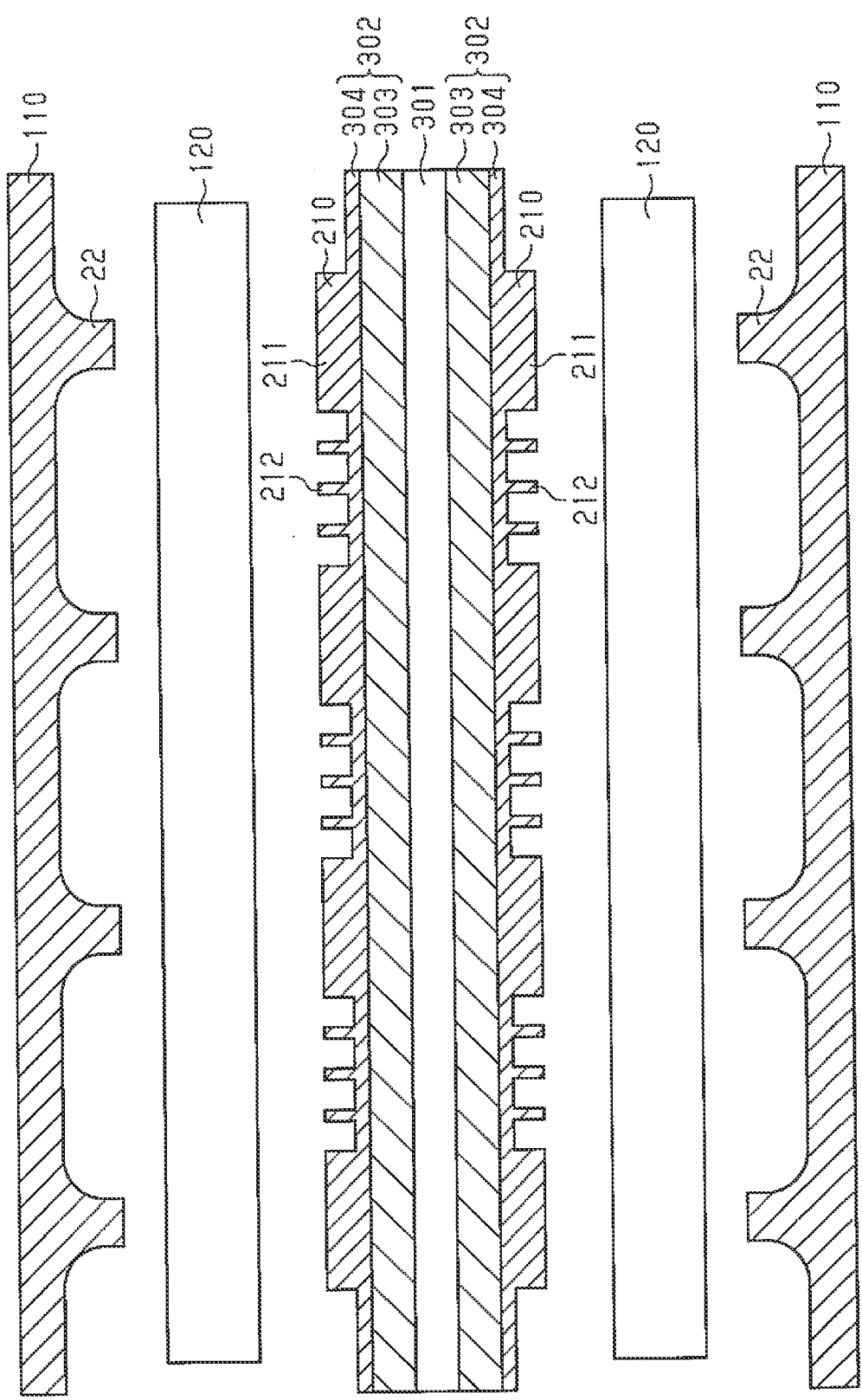

As illustrated in FIG. 14, a mold sheet 120 and a metal plate 110 are arranged above the first wiring layer 210 that is located at the upper side of the support body 301. In the same manner, a mold sheet 120 and a metal plate 110 are arranged below the first wiring layer 210 that is located at the lower side of the support body 301. The mold sheets 120 may be semi-cured thermosetting resin layers. The material of the semi-cured resin layers may be, for example, a thermosetting epoxy resin or a thermosetting polyolefin resin but is not limited to these resins. Alternatively, semi-cured resin layers containing an inorganic filler such as silica particles may be used as the mold sheets 120. The inorganic filler may be alumina particles or silicon carbide particles. Further, multiple kinds of particles may be used. The material of the mold sheets 120 may be a resin other than those described above. Each of the metal plates 110 includes the projections 22, which are formed by etching the metal plate 110 through the same steps as in FIGS. 4A to 4D. The metal plate 110 further includes a portion in which the wiring portions 21 are formed in a subsequent step (FIG. 19B). The material of the metal plates 110 may be, for example, copper or a copper alloy.

As illustrated in FIG. 15A, for example, the metal plates 110 are pressed toward the support body 301 in a vacuum atmosphere. The mold sheets 120 are heated and cured at a given temperature (for example, 190° C. to 230° C.) to form the insulation layers 30. This step obtains a structural body 310. In the structural body 310, a set of the carrier-added metal foil 302, the first wiring layer 210, the insulation layer 30, and the metal plate 110 is stacked at the upper side of the support body 301, and another set of the carrier-added metal foil 302, the first wiring layer 210, the insulation layer 30, and the metal plate 110 is stacked at the lower side of the support body 301.

In each carrier-added metal foil 302, the metal foil 304 is separated from the carrier plate 303 by the delamination layer (not illustrated) located between the metal foil 304 and the carrier plate 303. This obtains two structural bodies 311 as illustrated in FIG. 15B.

As illustrated in FIG. 16A, an etching mask 321 including openings 321X is formed on an upper surface 304a of the metal foil 304 of the structural body 311. The openings 321X of the etching mask 321 are formed in positions corresponding to the through holes 211X of the first wiring layer 210 illustrated in FIG. 11A. In the same manner as the etching masks described above, for example, a resist layer may be used as the etching mask 321.

A protective layer 322 is formed on the lower surface 110b of the metal plate 110. The protective layer 322 covers the entire lower surface 110b of the metal plate 110. The material of the protective layer 322 may be, for example, the same as the material of the etching mask 321. Alternatively, different materials may be used as the etching mask 321 and the protective layer 322.

As illustrated in FIG. 16B, the metal foil 304 and the pad portions 211 (first wiring layer 210) are etched from the openings 321X of the etching mask 321 to form the through holes 211X extending through the metal foil 304 and the pad portions 211. In the same manner as the etching described above, in the etching forming the through holes 211X, a ferric chloride solution or a cupric chloride solution may be used as the etchant. A spray etching machine may be used as the etching machine.

As illustrated in FIG. 16C, the through holes 31X are formed in the extensions 31 of the insulation layer 30 exposed in the openings 321X of the etching mask 321. A conventional resin removing process may be used to form the through holes 31X. The resin removing process is, for example, a desmear process using a potassium permanganate solution or a laser drilling using a $CO_2$ laser.

As illustrated in FIG. 17A, a resist layer 331 including openings 331X is formed to cover the upper surface of the metal foil 304. Also, a resist layer 332 is formed to cover the entire lower surface 110b of the metal plate 110. The material of the resist layers 331 and 332 may have, for example, resistance to plating performed in the next step. For example, a photosensitive dry film resist (e.g., novolac resin or acrylic resin) may be used as the resist layers 331 and 332. The upper surface of the metal foil 304 and the lower surface 110b of the metal plate 110 are, for example, laminated with dry films through thermocompression bonding, and the dry films are patterned through photolithography to form the resist layers 331 and 332. When the etching mask 321 and the protective layer 322 used in the etching illustrated in FIGS. 16B and 16C are not removed, the etching mask 321 and the protective layer 322 may be used as the resist layers 331 and 332.

As illustrated in FIG. 17A, electrolytic plating is performed on the structural body 311 with the metal plate 110 serving as the plating power feeding layer. Electrolytic plating allows the electrolytic plating film 153 (plating metal) to gradually deposit and grow on the upper surfaces 22a of the projections 22 of the metal plate 110 exposed in the through holes 31X and 211X. In the present example, the electrolytic plating film 153 is a copper plating film. Since the extensions 31 of the insulation layer 30 are thin, the electrolytic plating film 153 also deposits and grows on the wall surfaces of the through holes 211X extending through the pad portions 211 and the metal foil 304. Consequently, as illustrated in FIG. 17B, the through holes 31X and 211X are filled with the electrolytic plating film 153. The electrolytic plating film 153 connects the projections 22 of the metal plate 110, the pad portions 211, and the metal foil 304. The electrolytic plating film 153, which fills the through holes 31X and 211X, is formed as the connection vias 40 illustrated in FIG. 11A.

The resist layers 331 and 332 are removed. For example, an alkaline stripping solution is used to remove the resist layers 331 and 332.

In the second embodiment, the connection vias 40 are formed, for example, by a plating metal (electrolytic plating film 153) and do not include a seed layer. For example, when a copper clad core in which copper foils are applied to two opposite surfaces of an insulation layer is used to manufacture a wiring substrate, in order to form connection vias in through holes of the insulation layer, a seed layer needs to be formed on wall surfaces of the through holes in the insulation layer. In this regard, in the manufacturing process of the second embodiment, a seed layer does not need to be formed. This shortens the manufacturing time.

As illustrated in FIG. 18A, a protective layer 341 is formed on the lower surface 110b of the metal plate 110. The protective layer 341 covers the entire lower surface 110b of the metal plate 110. The protective layer 341 is, for example, a resist layer. The material of the resist layer may have, for example, resistance to etching performed in the next step. For example, a photosensitive dry film resist or liquid photoresist is used as the resist layer. The material of such a resist layer may be, for example, a novolac resin or an acrylic resin. For example, when a photosensitive dry film resist is used, the lower surface 110b of the metal plate 110 is laminated with a dry film through thermocompression bonding, and the dry film is patterned through exposure and development to form the protective layer 341. When a liquid photoresist is used, the protective layer 341 also may be formed through the same process.

Then, the metal foil 304 is etched. This obtains a structural body 312 including a wiring layer 210 embedded in the insulation layer 30 as illustrated in FIG. 18B. When a copper foil is used as the metal foil 304, a ferric chloride solution or a cupric chloride solution may be used as the etchant, and a spray etching machine may be used as the etching machine. Subsequently, the protective layer 341 is removed. When a resist layer is used as the protective layer 341, the protective layer 341 may be removed, for example, by an alkaline stripping solution.

Figure 19A:
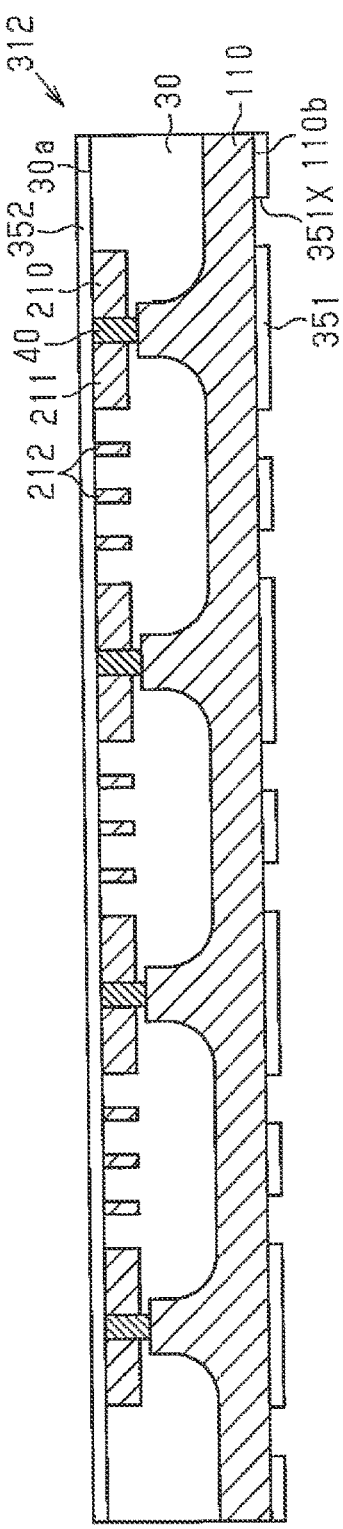
Figure 19B:
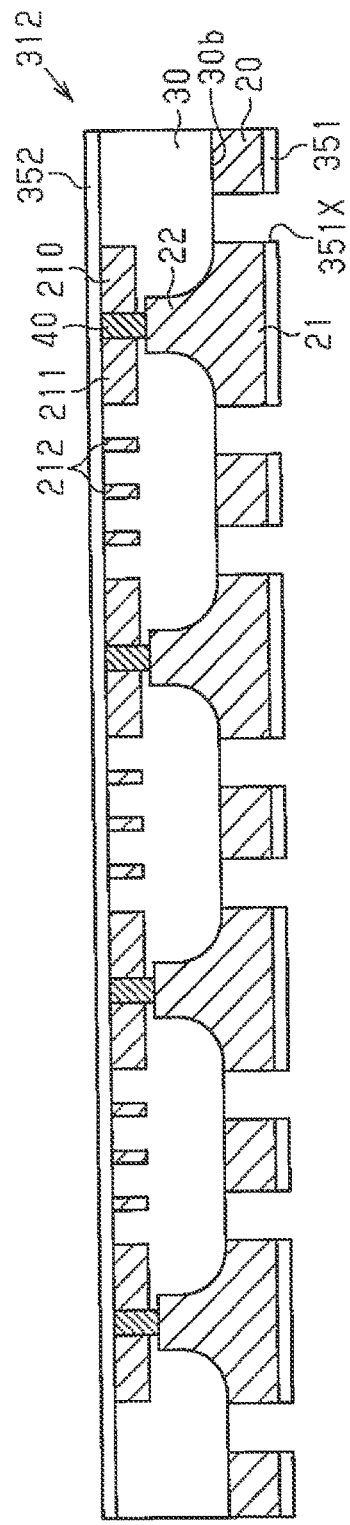

As illustrated in FIG. 19A, an etching mask 351 including openings 351X is formed on the lower surface 110b of the metal plate 110. The etching mask 351 is formed on positions corresponding to the wiring portions 21 of the second wiring layer 20, illustrated in FIG. 11A. In the same manner as the etching masks described above, the material of the etching mask 351 may have, for example, resistance to etching performed in the next step. A protective layer 352 covers the upper surface of the structural body 312, that is, the insulation layer 30 and the first wiring layer 210. In the same manner as the protective layers described above, the material of the protective layer 352 may have resistance to etching performed in the next step.

As illustrated in FIG. 19B, the metal plate 110 is etched from the openings 351X in the etching mask 351 to form through holes exposing the lower surface 30b of the insulation layer 30. This forms the wiring portions 21 of the second wiring layer 20.

Figure 19C:
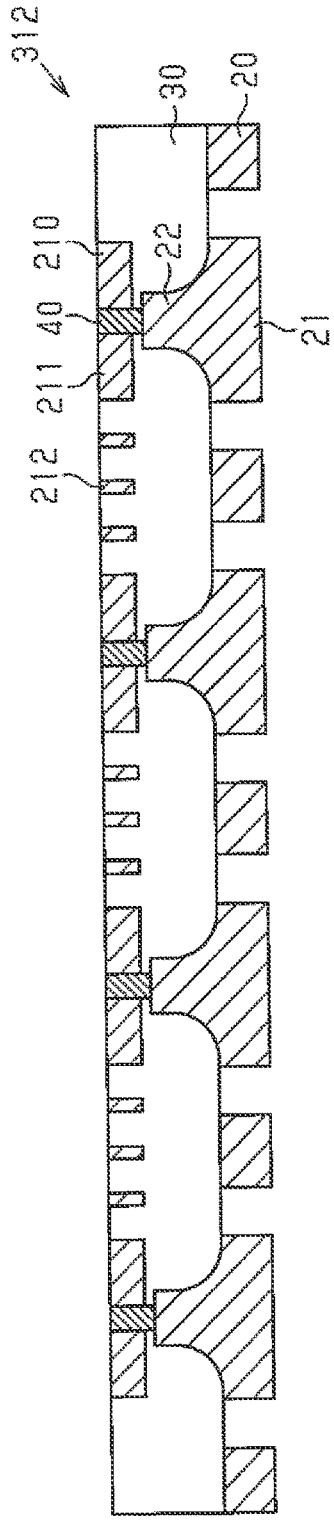

As illustrated in FIG. 19C, the etching mask 351 and the protective layer 352 (refer to FIG. 19B) are removed. When resist layers are used as the etching mask 351 and the protective layer 352, the etching mask 351 and the protective layer 352 may be removed, for example, by an alkaline stripping solution.

As illustrated in FIG. 20A, the solder resist layer 51 including the openings 51X and the solder resist layer 52 including the openings 52X are formed. Each of the openings 51X in the solder resist layer 51 partially exposes the upper surface 210a of the first wiring layer 210. Each of the openings 52X in the solder resist layer 52 partially exposes the lower surface 21b of the wiring portion 21 of the second wiring layer 20. The solder resist layer 51 is obtained, for example, by laminating with a photosensitive resin film or applying a resin liquid or paste and exposing and developing the resin through photolithography to be patterned into a desired shape. In the same manner, the solder resist layer 52 is obtained, for example, by laminating a photosensitive resin film or applying a resin liquid or paste and exposing and developing the resin through photolithography to be patterned into a desired shape.

As illustrated in FIG. 20B, the surface-processed layer 61 is formed on the upper surface 210a of the first wiring layer 210 exposed in the openings 51X of the solder resist layer 51. For example, when the surface-processed layer 61 is an Ni layer/Au layer, an Ni layer is formed on the upper surface 210a of the first wiring layer 210, and an Au layer is formed on the Ni layer to form the surface-processed layer 61. The Ni layer and the Au layer may be formed, for example, through electroless plating.

Also, the surface-processed layer 62 is formed on the lower surfaces 21b of the wiring portions 21 of the second wiring layer 20 exposed in the openings 52X of the solder resist layer 52. For example, when the surface-processed layer 62 is an Ni layer/Au layer, an Ni layer is formed on the lower surfaces 21b of the wiring portions 21, and an Au layer is formed on the Ni layer to form the surface-processed layer 62. The Ni layer and the Au layer may be formed, for example, through electroless plating.

The second embodiment has the advantages described below in addition to (1-1) to (1-3) of the first embodiment.

(2-1) The first wiring layer 210 is formed through electrolytic plating in which the metal foil 304 serves as the power feeding layer. The wiring portions 212 of the first wiring layer 210 are finer than those of a wiring layer formed by etching a metal plate. Thus, the wiring substrate 201 has a high wiring density.

(2-2) The carrier-added metal foils 302 are applied to two opposite surfaces of the support body 301. The two structural bodies 311 (refer to FIG. 15B) are formed using the metal foils 304 of the carrier-added metal foils 302. In the manufacturing process to obtain the structural bodies 311, bending is limited.

It should be apparent to those skilled in the art that the foregoing embodiments may be implemented in many other specific forms without departing from the scope of this disclosure. Particularly, it should be understood that the foregoing embodiments may be implemented in the following forms.

In the above embodiments, the surface-processed layer 61 is formed on the upper surfaces 10a and 210a of the first wiring layers 10 and 210. However, the surface-processed layer 61 may be omitted. In this case, the upper surfaces 10a and 210a of the first wiring layers 10 and 210 function as the external connection terminals P1, and an electronic component such as a semiconductor chip or another wiring substrate may be mounted on the external connection terminals P1.

In the above embodiments, the surface-processed layer 62 is formed on the lower surfaces 21b of the wiring portions 21 of the second wiring layer 20. However, the surface-processed layer 62 may be omitted. In this case, the lower surfaces 21b of the wiring portions 21 of the second wiring layer 20 function as the external connection terminals P2, and a circuit board such as a motherboard may be mounted on the external connection terminals P2 with bumps of, for example, solder.

In the above embodiments, the surface of the surface-processed layer 62 formed on the lower surfaces 21b of the wiring portions 21 of the second wiring layer 20 are used as the external connection terminals P2. Instead, the wiring portions 21 of the second wiring layer 20 may be used as bumps on which, for example, a circuit board is mounted.

Figure 22A:
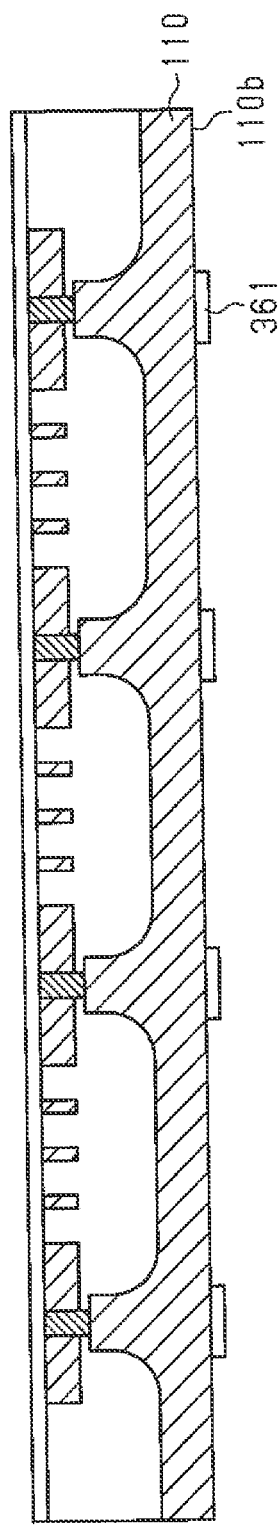
FIGS. 22A to 22C are schematic cross-sectional views illustrating a method for manufacturing a modified example of a wiring substrate.
Figure 22B:
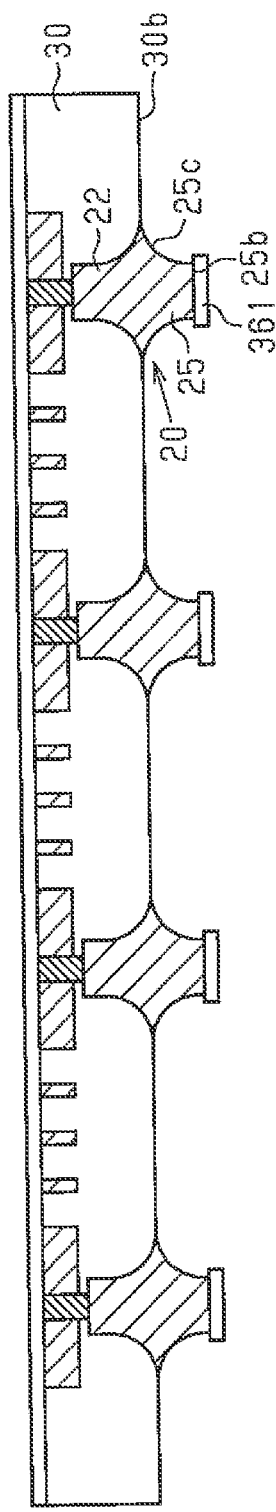
Figure 22C:
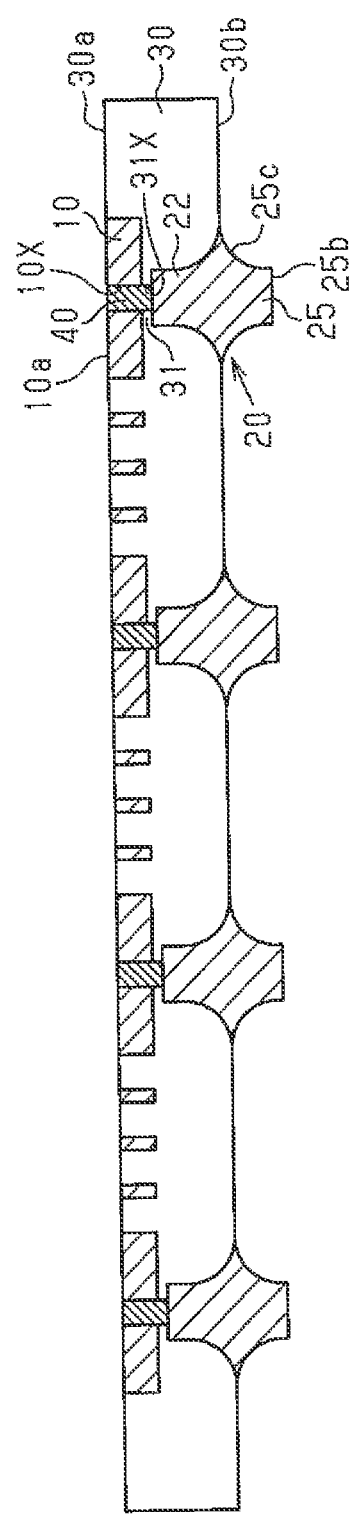

FIGS. 22A to 22C illustrate one example of a process for forming wiring portions 25 in the second wiring layer 20 as bumps.

As illustrated in FIG. 22A, a resist layer 361 is formed on desired positions of the lower surface 110b of the metal plate 110. The resist layer 361 corresponds to positions where bumps are to be formed.

As illustrated in FIG. 22B, the metal plate 110 (refer to FIG. 22A) is etched to form the wiring portions 25 (terminal portions) in the second wiring layer 20 at lower positions than the lower surface 30b of the insulation layer 30. In the same manner as the projections 22 (embedded portions), each of the wiring portions 25 has a lower surface 25b and a curved side surface 25c. The curved side surface 25c flares sideward from the lower surface 25b toward the lower surface 30b of the insulation layer 30. Thus, the cross section of the wiring portion 25 in a plan view enlarges from the lower surface 25b of the wiring portion 25 toward the lower surface 30b of the insulation layer 30. Further, the curved side surface 25c of the wiring portion 25 is concave toward an inner side of the wiring portion 25 from the lower surface 25b of the wiring portion 25 to the lower surface 30b of the insulation layer 30. Subsequently, as illustrated in FIG. 22C, the resist layer 361 (refer to FIG. 22B) is removed. The wiring portions 25 formed in this manner may be used as bumps.

In the above embodiments, a pad (die pad) on which a semiconductor chip is mounted may be formed.

As illustrated in FIG. 23A, a wiring substrate 401 includes a first wiring layer 410 and a second wiring layer 420. The first wiring layer 410 includes a pad portion 411. The second wiring layer 420 includes a pad portion 421. The solder resist layer 51 partially covers the upper surface of the insulation layer 30 and the first wiring layer 410 and includes the openings 51X exposing the upper portion of the pad portion 411. The solder resist layer 52 partially covers the lower surface of the insulation layer 30 and the second wiring layer 420 and includes the openings 52X partially exposing the lower surface of the pad portion 421.

As illustrated in FIG. 23B, a semiconductor chip 481 is face-up-mounted on the pad portion 411. The semiconductor chip 481 is mounted on the pad portion 411 by an adhesion layer (not illustrated) applied between a lower surface 481b of the semiconductor chip 481 and an upper surface 411a of the pad portion 411. The semiconductor chip 481 has an upper surface 481a including electrode terminals (not illustrated) connected by metal wires 482 to an upper surface 410a of the first wiring layer 410 exposed in the openings 51X of the solder resist layer 51. In the same manner as in the wiring substrate 1 of the first embodiment, a surface-processed layer (not illustrated) is formed on the upper surface 410a of the first wiring layer 410. The adhesion layer may be, for example, a die-bonding material (die-attaching material) such as an epoxy resin, or a silver paste in which a silver filler is dispersed in an insulative resin such as an epoxy resin. The metal wires 482 may be, for example, a gold (Au) wire, an aluminum (Al) wire, or a copper (Cu) wire. A resin layer (e.g., epoxy resin layer) may be formed to cover the semiconductor chip 481 and the metal wires 482.

As described above, when the pad portion 411 is formed in the first wiring layer 410 as a die pad, the wiring substrate 401 may be used as a module board on which the semiconductor chip 481 is mounted. Additionally, when the pad portion 421 is formed in the second wiring layer 420 and the semiconductor chip 481 is mounted on the pad portion 411 of the first wiring layer 410, the pad portion 421 efficiently dissipates heat from the semiconductor chip 481 to the exterior. Further, a heat dissipation member may be directly connected to the pad portion 421 of the second wiring layer 420.

Figure 24A:
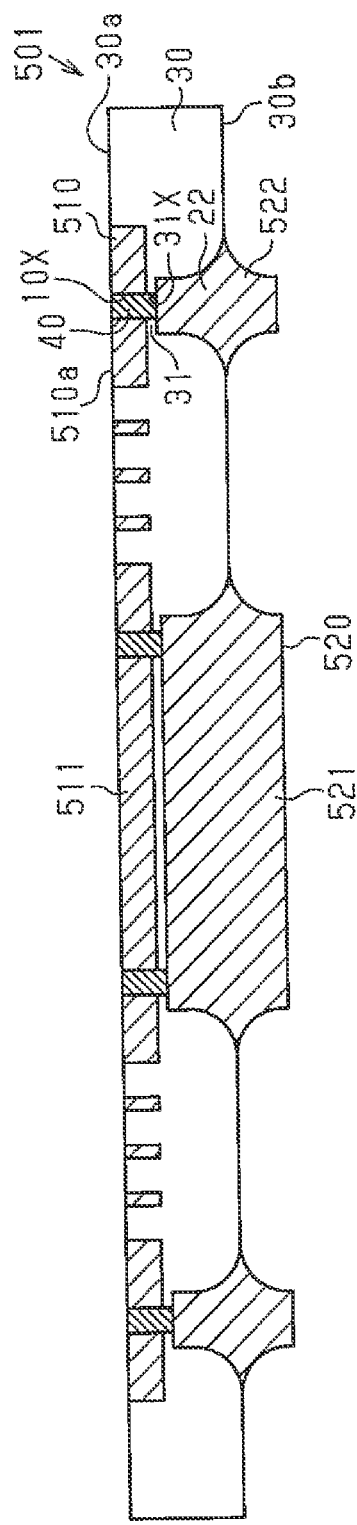
FIG. 24A is a schematic cross-sectional view illustrating a modified example of a wiring substrate.
Figure 24B:
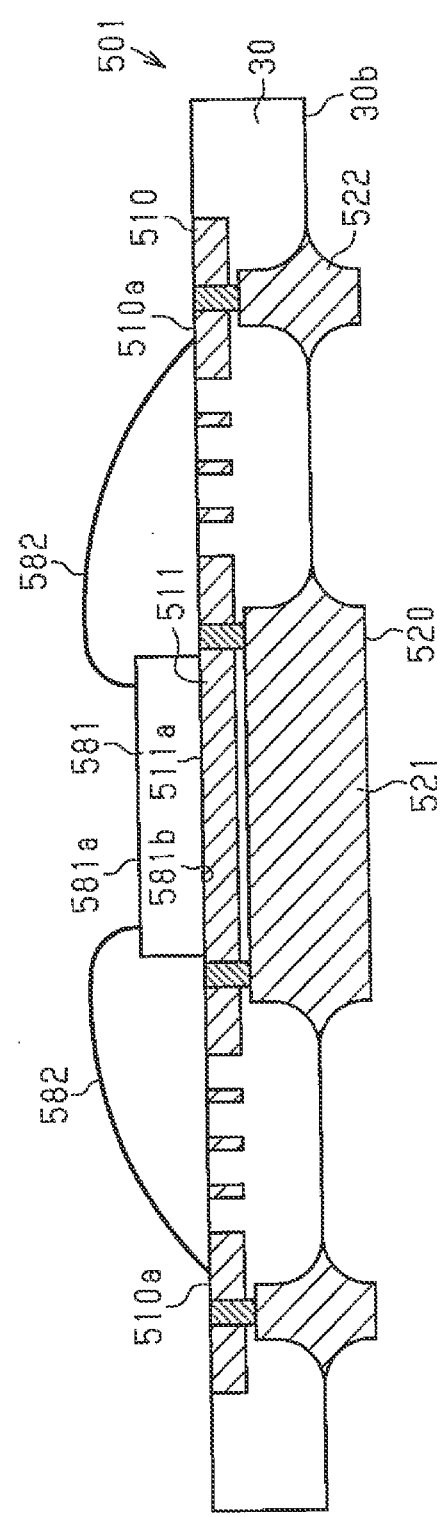
FIG. 24B is a schematic cross-sectional view of a semiconductor device including the wiring substrate illustrated in FIG. 24A.

FIG. 24A illustrates a wiring substrate 501 including a first wiring layer 510 and a second wiring layer 520. The first wiring layer 510 includes a pad portion 511. The second wiring layer 520 includes a pad portion 521. The second wiring layer 520 includes wiring portions 522 located at lower positions than the lower surface 30b of the insulation layer 30. The wiring portions 522 may be used as bumps. As illustrated in FIG. 24B, a semiconductor chip 581 is face-up-mounted on the pad portion 511 of the first wiring layer 510. The semiconductor chip 581 is mounted on the pad portion 511 by an adhesion layer (not illustrated) applied between a lower surface 581b of the semiconductor chip 581 and an upper surface 511a of the pad portion 511. The semiconductor chip 581 has an upper surface 581a including electrode terminals (not illustrated) connected by metal wires 582 to an upper surface 510a of the first wiring layer 510. A surface-processed layer (not illustrated) is formed on the upper surface 510a of the first wiring layer 510 in the same manner as in the wiring substrate 1 of the first embodiment. The adhesion layer may be, for example, a die-bonding material (die-attaching material) such as an epoxy resin, or a silver paste in which a silver filler is dispersed in an insulative resin such as an epoxy resin. The metal wires 582 may be, for example, a gold (Au) wire, an aluminum (Al) wire, or a copper (Cu) wire. A resin layer (e.g., epoxy resin layer) may be formed to cover the semiconductor chip 581 and the metal wires 582.

As described above, when the pad portion 511 is formed in the first wiring layer 510 as a die pad, the wiring substrate 501 may be used as a module board on which the semiconductor chip 581 is mounted. Additionally, when the pad portion 521 is formed in the second wiring layer 520 and the semiconductor chip 581 is mounted on the pad portion 511 of the first wiring layer 510, the pad portion 521 efficiently dissipates heat from the semiconductor chip 581 to the exterior. Further, a heat dissipation member may be directly connected to the pad portion 521 of the second wiring layer 520.

The shape of components of the above embodiments may be changed.

Figure 25A:
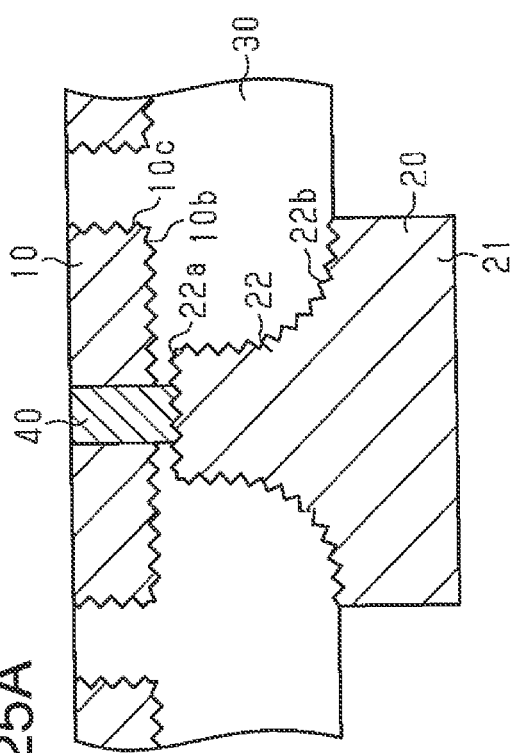
FIGS. 25A to 25D are partially enlarged cross-sectional views illustrating various modified examples of wiring substrates.

As illustrated in FIG. 25A, surfaces contacting the insulation layer 30 may be rough. In the example illustrated in FIG. 25A, the lower surface 10b and the side surfaces 10c of the first wiring layer 10 are rough, and the side surface 22b and the upper surface 22a of the projection 22 (embedded portion) of the second wiring layer 20 are rough. Such rough surfaces increase the adhesiveness between the insulation layer 30 and the wiring layers 10 and 20. The roughening process forming rough surfaces may be, for example, blackening, etching, a process using a laser, or blasting. One of the first wiring layer 10 and the second wiring layer 20 may include rough surfaces.

Figure 25B:
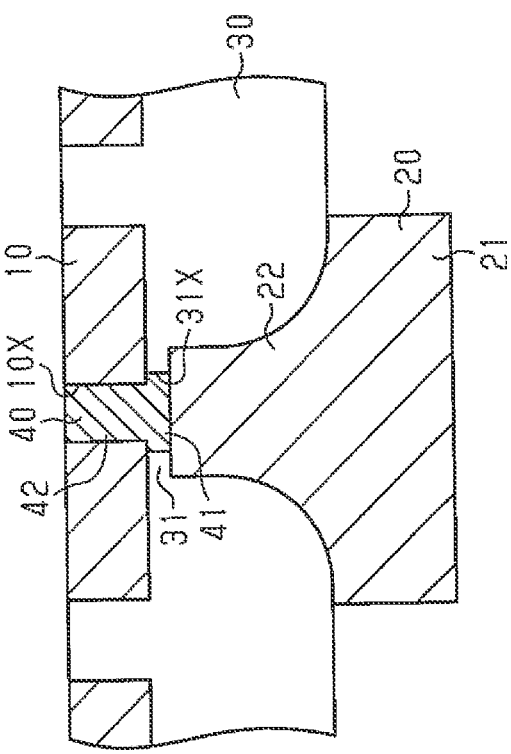

As illustrated in FIG. 25B, the through hole 31X of the extension 31 of the insulation layer 30 may have a larger diameter than the through hole 10X of the first wiring layer 10. For example, after the through hole 10X of the first wiring layer 10 is formed, the time of the resin removing process for forming the through hole 31X may be adjusted to form the through hole 31X having a larger diameter than the through hole 10X. When the through holes 10X and 31X are formed as described above, while the extension 31 of the insulation layer 30 is formed between the first wiring layer 10 and the projection 22 of the second wiring layer 20, the area where the connection via 40 is connected to the first wiring layer 10 and the area where the connection via 40 is connected to the second wiring layer 20 are increased.

Figure 25C:
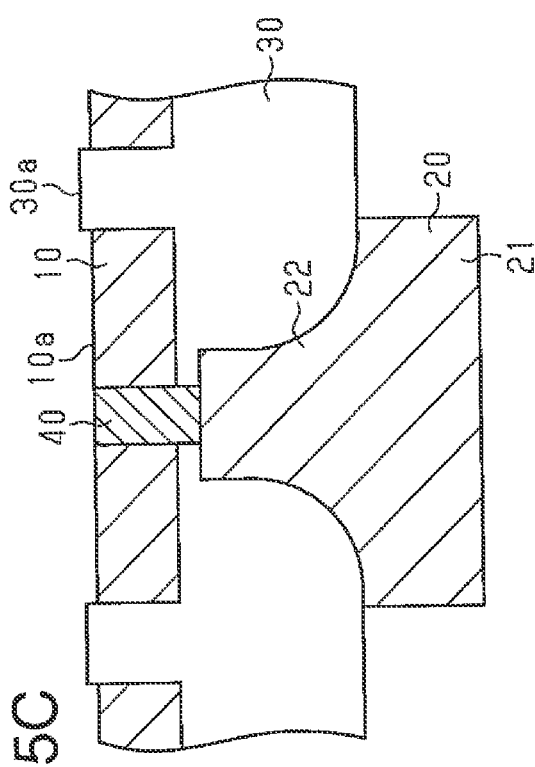

As illustrated in FIG. 25C, the upper surface 30a of the insulation layer 30 may be located at a higher position than the upper surface 10a of the first wiring layer 10. Such a structure includes a recess that allows for easy mounting, for example, when a semiconductor chip is face-down-mounted on a die pad of the first wiring layer 10.

Figure 25D:
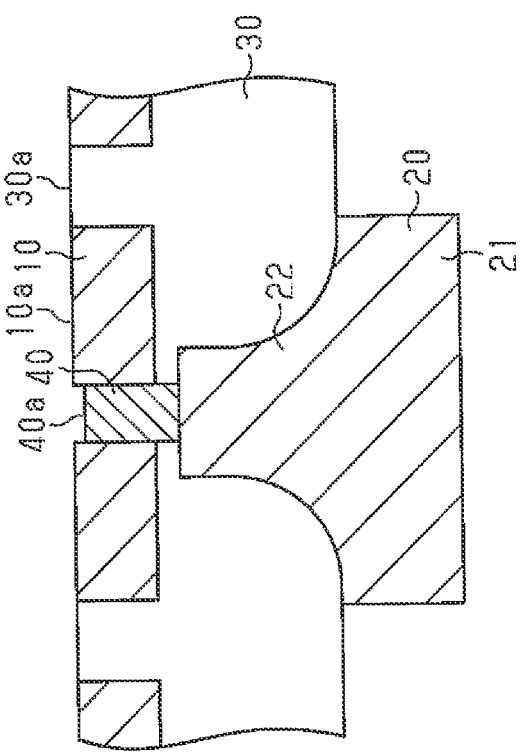

As illustrated in FIG. 25D, the connection via 40 may have an upper surface 40a located at a lower position than the upper surface 10a of the first wiring layer 10. Even this structure ensures the connection between the connection via 40 and the first wiring layer 10, that is, the connection needed between the first wiring layer 10 and the second wiring layer 20. As the upper surface 40a of the connection via 40 is lower than the upper surface 10a of the first wiring layer 10, the time needed to form the connection via 40, that is, the time to perform electrolytic plating, is shortened. Thus, the manufacturing time is shortened.

In the above embodiments, for example, in the step illustrated in FIG. 6B, the first metal plate 100 is etched to form the through holes 10X. Instead, laser drilling may be performed to form the through holes 10X. In this case, the through holes 31X may be also formed in the insulation layer 30 through laser drilling. Laser drilling may be performed, for example, with a $CO_2$ laser. Subsequent to the laser drilling, a desmear process may be performed to remove residues from the through holes 10X and 31X as necessary.

In the second embodiment, the carrier-added metal foils 302 are formed on two opposite surfaces of the support body 301. The metal foils 304 of the carrier-added metal foils 302 are used to manufacture the two structural bodies 311 including the first wiring layers 210 (refer to FIG. 15B). Each of the structural bodies 311 forms the wiring substrate 201 (refer to FIG. 11A). Instead, the carrier-added metal foil 302 may be formed on one surface (upper or lower surface) of the support body 301, and the metal foil 304 of the carrier-added metal foil 302 may be used to form the wiring substrate 201.

Clauses

This disclosure further encompasses embodiments describes below.

1. A method for manufacturing a wiring substrate, the method including:
    etching a first metal plate including a first surface and an opposite second surface from the first surface to form a first wiring layer in the first metal plate;
    etching a second metal plate including a first surface and an opposite second surface from the first surface of the second metal plate to form a projection in the second metal plate;
    arranging a semi-cured resin layer between the first metal plate and the second metal plate so that the first wiring layer faces an upper surface of the semi-cured resin layer and so that the projection faces a lower surface of the semi-cured resin layer;
    forming an insulation layer in which the first wiring layer and the projection are embedded by pressing the first metal plate and the second metal plate toward the semi-cured resin layer and curing the semi-cured resin layer;
    forming a through hole that extends through the first metal plate and the insulation layer and partially exposes an upper surface of the projection;
    forming a connection via connecting the first metal plate and the second metal plate by forming a plating metal in the through hole through electrolytic plating;
    etching the first metal plate from the second surface of the first metal plate so that the first wiring layer embedded in the insulation layer remains; and
    patterning the second metal plate from the second surface of the second metal plate to form a wiring portion located at a lower position than a lower surface of the insulation layer.

2. A method for manufacturing a wiring substrate, the method including:
    preparing a support plate, wherein the support plate includes a carrier plate and a metal foil laminated on a lower surface of the carrier plate with a delamination layer located in between;
    forming a first wiring layer on a lower surface of the metal foil of the support plate through electrolytic plating;
    etching a metal plate to form a projection in the metal plate;
    arranging a semi-cured resin layer between the support plate and the metal plate so that the first wiring layer faces an upper surface of the semi-cured resin layer and so that the projection faces a lower surface of the semi-cured resin layer;
    forming an insulation layer in which the first wiring layer and the projection are embedded by pressing the support plate and the metal plate toward the semi-cured resin layer and curing the semi-cured resin layer;
    separating the carrier plate from the metal foil;
    forming a through hole that extends through the metal foil, the first wiring layer, and the insulation layer and partially exposes an upper surface of the projection;
    forming a connection via connecting the first wiring layer and the metal plate by forming a plating metal in the through hole through electrolytic plating;
    removing the metal foil; and
    patterning the metal plate to form a wiring portion located at a lower position than a lower surface of the insulation layer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:
1. A wiring substrate comprising:
    an insulation layer;
    a first wiring layer embedded in the insulation layer with an upper surface of the first wiring layer exposed from the insulation layer;
    a second wiring layer including:
        a terminal portion located at a lower position than a lower surface of the insulation layer, and
        an embedded portion embedded in the insulation layer; and a connection via connecting the first wiring layer and the embedded portion of the second wiring layer, wherein the insulation layer includes an extension between the embedded portion of the second wiring layer and a lower surface of the first wiring layer, wherein the extension of the insulation layer includes a through hole extending through the extension in a thickness-wise direction, wherein the first wiring layer includes a through hole extending through the first wiring layer in the thickness-wise direction at the same position as the through hole of the extension in a plan view, wherein the connection via is integrally arranged in the through hole of the first wiring layer and the through hole of the insulation layer, the connection via including:
  a through portion located in the through hole of the first wiring layer; and
  a connection portion located in the through hole of the insulation layer, and wherein the through hole of the insulation layer has a diameter that is larger than a diameter of the through hole of the first wiring layer.

2. The wiring substrate according to claim 1, wherein the upper surface of the first wiring layer and an upper surface of the insulation layer are located at the same height.

3. The wiring substrate according to claim 1, wherein an upper surface of the connection via is located at a lower position than the upper surface of the first wiring layer.

4. A semiconductor device comprising:

the wiring substrate according to claim 1; and at least one electronic component mounted on the wiring substrate.

* * * * *